US012777977B2

(12) United States Patent
An et al.

(10) Patent No.: US 12,777,977 B2
(45) Date of Patent: Oct. 27, 2026

(54) DISPLAY PANEL AND DISPLAY DEVICE

(71) Applicant: Tianma Advanced Display Technology Institute (Xiamen) Co., Ltd., Xiamen (CN)

(72) Inventors: Feifei An, Xiamen (CN); Sitao Huo, Xiamen (CN)

(73) Assignee: Tianma Advanced Display Technology Institute (Xiamen) Co., Ltd., Xiamen (CN)

( * ) Notice: Subject to any disclaimer, the term of this patent is extended or adjusted under 35 U.S.C. 154(b) by 440 days.

(21) Appl. No.: 18/380,346

(22) Filed: Oct. 16, 2023

(65) Prior Publication Data

US 2024/0038737 A1 Feb. 1, 2024

(30) Foreign Application Priority Data

May 18, 2023 (CN) ......................... 202310567654.1

(51) Int. Cl.

| | |
|---|---|
| ***H10W 90/00*** | (2026.01) |
| ***H10H 20/84*** | (2025.01) |
| ***H10H 20/855*** | (2025.01) |
| ***H10H 29/855*** | (2025.01) |

(52) U.S. Cl.

CPC ............ *H10W 90/00* (2026.01); *H10H 20/84* (2025.01); *H10H 29/8552* (2025.01); *H10H 20/855* (2025.01)

(58) Field of Classification Search

CPC ... H10H 20/84; H10H 20/855; H10H 20/8552
See application file for complete search history.

(56) References Cited

U.S. PATENT DOCUMENTS

2020/0111936 A1* 4/2020 Lee ...................... H10H 29/142
2023/0352457 A1* 11/2023 Liu ...................... H10W 90/00

FOREIGN PATENT DOCUMENTS

| | | | | | |
|---|---|---|---|---|---|
| CN | 109256052 A | | 1/2019 | | |
| CN | 113745391 A | * | 12/2021 | ........... | H10H 20/856 |
| CN | 114038873 A | * | 2/2022 | ........... | H10H 20/857 |
| CN | 114122234 A | * | 3/2022 | ........... | H10H 29/142 |

* cited by examiner

*Primary Examiner* — Mariceli Santiago
(74) *Attorney, Agent, or Firm* — KDW FIRM PLLC

(57) ABSTRACT

Provided is a display panel including a substrate, a drive array layer, a light-shielding layer and multiple light-emitting components. The drive array layer is located on a side of the substrate and includes multiple first grooves. The light-shielding layer is located on a side of the drive array layer facing away from the substrate, the light-shielding layer includes multiple first openings, the multiple first openings penetrate through the light-shielding layer, and an orthographic projection of a first groove on the substrate at least partially surrounds an orthographic projection of a respective first opening of the multiple first openings on the substrate. An orthographic projection of a light-emitting component on the substrate at least partially overlaps with an orthographic projection of a respective first opening of the multiple first openings on the substrate. At least part of the light-shielding layer is located within the multiple first grooves.

19 Claims, 23 Drawing Sheets

DISPLAY PANEL AND DISPLAY DEVICE

CROSS-REFERENCE TO RELATED APPLICATION(S)

This application claims priority to Chinese Patent Application No. 202310567654.1 filed May 18, 2023, the disclosure of which is incorporated herein by reference in its entirety.

TECHNICAL FIELD

The present disclosure relates to the field of display technologies, and in particular to, a display panel and a display device.

BACKGROUND

The microelement technology refers to an array of micro-sized elements integrated at high density on a substrate. As an emerging display technology, the microelement display has more advantages than a liquid crystal display (LCD) and an organic light-emitting diode (OLED) display, such as lower power consumption, a higher color gamut, and a faster response rate, and the microelement display has lower requirements for encapsulating the water and oxygen isolation. Therefore, a mini light-emitting diode (Mini LED) and a micro light-emitting diode (Micro LED) are considered to be a more promising display technology.

Distinguished from a fabrication manner in which an organic light-emitting diode display panel adopts a film layer deposition, light-emitting elements arranged in a Micro-LED display panel or a Mini LED display panel are mainly implemented by adopting the transfer technology, in a preparation process, the micro-LED is generally transferred to a display substrate by using a light-emitting diode transfer device, however, there are many technical difficulties that need to be overcome at present, such as problems that large amount of transfer is difficult, poor binding easily occurs, the yield of the finished product is low, and the display effect cannot be ensured.

Therefore, it is an urgent technical problem to be solved by those skilled in the art to provide a display panel and a display device which can not only reduce the transfer difficulty of the light-emitting diode, but also facilitate improving the binding yield and ensuring the display quality.

SUMMARY

In view of this, the present disclosure provides a display panel and a display device, so as to solve problems in the existing microelement display technology that large amount of transfer is difficult, poor binding easily occurs, the yield of the finished product is low, and the display effect cannot be ensured.

The present disclosure discloses a display panel. The display panel includes a substrate, a drive array layer, a light-shielding layer and multiple light-emitting components. The drive array layer is located on a side of the substrate and includes multiple first grooves. The light-shielding layer is located on a side of the drive array layer facing away from the substrate, the light-shielding layer includes multiple first openings, the multiple first openings penetrate through the light-shielding layer, and an orthographic projection of a first groove of the multiple first grooves on the substrate at least partially surrounds an orthographic projection of a respective first opening of the multiple first openings on the substrate. An orthographic projection of a light-emitting component of the multiple light-emitting components on the substrate at least partially overlaps with the orthographic projection of the respective first opening of the multiple first openings on the substrate. At least part of the light-shielding layer is located within the multiple first grooves.

Based on the same inventive concept, the present disclosure further discloses a display device, and the display device includes the display panel described above.

BRIEF DESCRIPTION OF DRAWINGS

The drawings, which are incorporated in and constitute a part of the specification, illustrate embodiments of the present disclosure, and the drawings together with the description thereof serve to explain principles of the present disclosure.

DETAILED DESCRIPTION

Figure 1:
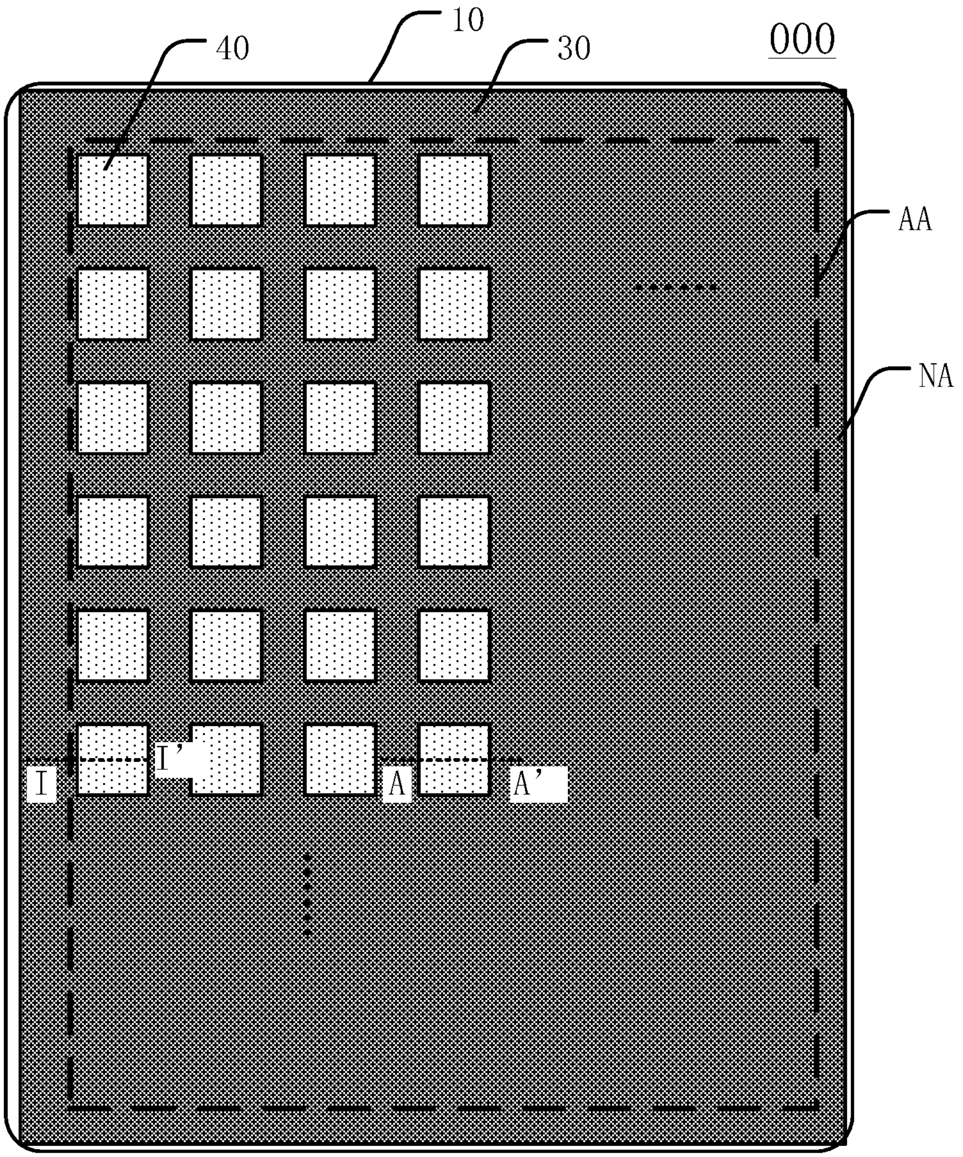
FIG. 1 is a plan view of a display panel according to an embodiment of the present disclosure.

Various exemplary embodiments of the present disclosure will now be described in detail with reference to the drawings. It should be noted that the relative arrangements, numerical expressions, and numerical values of the components and steps set forth in these embodiments do not limit the scope of the present disclosure unless specifically stated otherwise.

The following description of at least one exemplary embodiment is merely illustrative in nature and is in no way intended to limit the present disclosure, as well as the application or use thereof.

Techniques, methods, and apparatuses known to those of ordinary skill in the art may not be discussed in detail, but such techniques, methods, and apparatuses should, where appropriate, be considered as a part of the specification.

In all instances shown and discussed herein, any specific value is to be interpreted as illustrative only and not as limiting. Therefore, other instances of exemplary embodiments may have different values.

Various modifications and changes in the present disclosure will become apparent to those skilled in the art without departing from the spirit or scope of the present disclosure.

Therefore, the present disclosure is intended to cover modifications and variations of the present disclosure that fall within the scope of the corresponding claims (the claimed technical schemes) and their equivalents. It should be noted that implementations provided in the embodiments of the present disclosure may be combined with each other without conflict.

It should be noted that like reference numerals and letters denote like terms in the following drawings, and therefore, once a certain item is defined in one drawing, no further discussion thereof is required in subsequent drawings.

Figure 2:
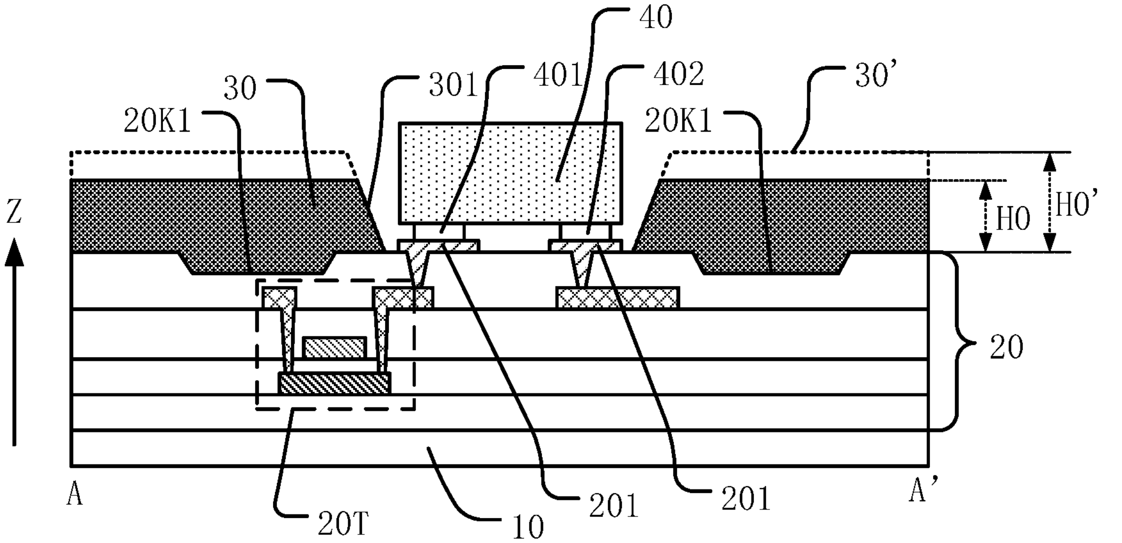
FIG. 2 is a cross-sectional view taken along a direction A-A' of FIG. 1.

Referring to FIGS. 1 and 2, FIG. 1 is a plan view of a display panel according to an embodiment of the present disclosure, FIG. 2 is a cross-sectional view taken along a direction A-A' of FIG. 1, the display panel 000 provided in this embodiment includes a substrate 10, a drive array layer 20, a light-shielding layer 30 and multiple light-emitting components 40. The drive array layer 20 is located on a side of the substrate 10 and includes multiple first grooves 20K1. The light-shielding layer 30 is located on a side of the drive array layer 20 facing away from the substrate 10, the light-shielding layer 30 includes multiple first openings 301, the multiple first openings 301 penetrate through the light-shielding layer 30, an orthographic projection of a first groove of the multiple first grooves 20K1 on the substrate 10 at least partially surrounds an orthographic projection of a respective first opening of the multiple first openings 301 on the substrate 10. The orthographic projection of the light-emitting component of the multiple light-emitting components 40 on the substrate 10 at least partially overlaps with the orthographic projection of the respective first opening of the multiple first openings 301 on the substrate 10. At least part of the light-shielding layer 30 is located within the multiple first grooves 20K1.

Specifically, the display panel 000 provided in this embodiment may be a mini light-emitting diode (mini LED) display panel or a micro light-emitting diode (micro LED) display panel. A film layer structure of the display panel 000 includes a substrate 10. The substrate 10 may be used as a carrier substrate of the display panel 000 and used for fabricating and disposing a remaining structure of the display panel 000 on the substrate 10, for example, in this embodiment, the substrate 10 may be used for fabricating a film layer structure such as the drive array layer 20, the light-shielding layer 30 and the light-emitting components 40 on the side of the substrate 10. It should be understood that the drive array layer 20 may include a structure of multiple conductive metal layers and multiple insulating layers, the drive array layer 20 may be understood as a film layer for fabricating a driver circuit structure for driving the light-emitting component 40 to emit light, such as a circuit structure for fabricating a thin film transistor 20T for driving the light-emitting component 40 to emit light, and a source or a drain of the thin film transistor 20T is electrically connected to an anode of the light-emitting component 40. The display panel 000 in this embodiment includes multiple light-emitting components 40, and a region in which at least one light-emitting component 40 is located may be understood as a pixel region in which the display panel 000 is divided. It should be understood that in FIG. 1 of this embodiment, only an example in which the multiple light-emitting components 40 are arranged in an array is used for exemplary description, and in a specific implementation, an arrangement manner of the multiple light-emitting components 40 in the display panel 000 includes, but is not limited to, this. The light-emitting component 40 in this embodiment may be any one of a mini light-emitting diode or a micro light-emitting diode. In a specific implementation, the light-emitting component 40 may be transferred to a display substrate on which the fabrication of a film layer such as the drive array layer 20 has been completed by using a large amount of transfer technologies. Optionally, the light-shielding layer 30 in this embodiment may be fabricated before the light-emitting component 40 is transferred to the display substrate, or the light-shielding layer 30 may be fabricated after the light-emitting component 40 is transferred to the display substrate. In this embodiment, an example in which the light-shielding layer 30 is fabricated before the light-emitting element 40 is transferred to the display substrate is used for exemplary description. In a specific implementation, the light-shielding layer 30 may be selected and set according to practical requirements.

In this embodiment, the side of the drive array layer 20 facing away from the substrate 10 further includes the light-shielding layer 30. A material for fabricating the light-shielding layer 30 may be an insulating material capable of shielding the light. The specific fabrication material of the light-shielding layer 30 is not limited in this embodiment. The light-shielding layer 30 includes the multiple first openings 301, the multiple first openings 301 penetrate through the light-shielding layer 30. The drive array layer 20 may include a binding layer, the binding layer is located on a side of the drive array layer 20 facing away from the substrate 10, that is, on a side of the light-shielding layer 30 facing the substrate 10, the binding layer is used for fabricating the binding electrode 201 of the subsequent binding light-emitting component 40, the first openings 301 formed in the light-shielding layer 30 are used for exposing the binding electrode 201 of the binding layer, so that after the light-emitting components 40 are subsequently transferred, the orthographic projection of the light-emitting component of the light-emitting components 40 on the substrate 10 at least partially overlaps with the orthographic projection of the respective first opening of the first openings 301 on the substrate 10, in this first opening 301, a cathode and an anode of the light-emitting component 40 are respectively bound with and electrically connected to the binding electrodes 201 exposed by the first openings 301, the source or drain of the thin film transistor 20T in the drive array layer 20 is electrically connected to the anode 401 of the light-emitting component 40, and a cathode signal line in the drive array layer 20 is electrically connected to the cathode 402 of the light-emitting component 40 (it should be understood that, the binding electrode 201 may be electrically connected to the cathode 401 and the anode 402 of the light-emitting component 40 by a conductive structure such as solder or an eutectic layer, which is not illustrated in FIG. 2 and will not be described in this embodiment), so that the driver circuit in the drive array layer 20 provides a signal for driving the light-emitting component 40 to emit light, thereby achieving the display function of the display panel 000. The light-shielding layer 30 of this embodiment is provided with the first opening 301 only at a position where the light-emitting component 40 needs to be bound, and the remaining regions are shielded by the material of the light-shielding layer 30, so that the screen reflectivity can be effectively reduced, and thus the influence of external light on the display effect of the display panel 000 can be avoided.

In order to achieve a large amount of transfer of micro-elements such as the light-emitting component 40 of this embodiment, the grown light-emitting component 40 may be transferred to a display substrate on which the fabrication of the film layer such as the drive array layer 20 has been completed by using a microstamp transfer technique. When the light-emitting component 40 is grown on a growth substrate, the light-emitting component 40 is adsorbed by the microstamp and then transferred to the display substrate, because the film layer structure below the light-emitting component 40 is relatively large, the structure of the driver circuit of the drive array layer 20 is relatively complex, and the fluidity of the light-shielding layer 30 around the light-emitting component 40 before uncuring is poor, so that a thickness of the light-shielding layer 30 after curing is relatively thick. In order to facilitate the adsorption of the light-emitting component 40, the microstamp used for transferring is slightly greater than the light-emitting component 40. If a thickness of the light-shielding layer 30 around the first opening 301 is relatively thick, a height of the film layer on the substrate 10 around the first opening 301 is relatively high, and the microstamp is transferred to the light-emitting component 40, then it easily occurs that the binding bonding of the light-emitting component 40 to the binding electrode 201 has not been completed in a process of depressing to the binding electrode 201, and is hindered by the film layer around the first opening 301, the depression operation of the microstamp is interfered, whereby the transfer risk of the light-emitting component 40 is significantly increased, and the binding yield is not improved. In the related art, in order to reduce the interference risk, the first opening 301 of the light-shielding layer 30 is generally opened relatively large, and the edge of the light-shielding layer 30 is far away from the light-emitting component 40, so that enough space for the depression of the microstamp is left. However, after the first opening 301 of the light-shielding layer 30 is extended, the interference risk can be reduced, but an effective shielding area of the light-shielding layer 30 is greatly reduced, and the effect of reducing the reflectivity is greatly affected.

In order to solve the above-described problems, in this embodiment, the drive array layer 20 is provided to include the multiple first grooves 20K1, an orthographic projection of a first groove of the multiple first grooves 20K1 on the substrate 10 at least partially surrounds an orthographic projection of a respective first opening of the multiple first openings 301 on the substrate 10, and optionally, the drive array layer 20 may include multiple metal layers and multiple insulating layers. In this embodiment, the first grooves 20K1 provided in the drive array layer 20 may be understood as the first grooves 20K1 provided in any one or more of the multiple film layers of the drive array layer 20. In FIG. 2 of this embodiment, an example in which a film layer of the first grooves 20K1 is a planarization layer facing to the light-shielding layer 30 is used for exemplary description. After the structure such as the driver circuit of the drive array layer 20 is fabricated and completed, an insulating planarization layer needs to be provided so as to planarize the fabrication film layer of the subsequent light-shielding layer 30.

In a specific implementation, the film layer of the first groove 20K1 may be any one or more film layers between the light-shielding layer 30 and the substrate 10, that is, any one or more film layers of the drive array layer 20 are cooperated to form the first groove 20K1, which is not limited here in this embodiment. Since the orthographic projection of the first groove of the multiple first grooves 20K1 on the substrate 10 at least partially surrounds the orthographic projection of the respective first opening of the multiple first openings 301 on the substrate 10, so that the drive array layer 20 in a region where the first groove 20K1 is located may be depressed to a certain extent, and a depression height is the depth of the first groove 20K1. As a result of the arrangement of the first grooves 20K1 in the drive array layer 20, in a fabrication process of the light-shielding layers 30, before the light-shielding layer 30 is not cured, the light-shielding layer 30 flows and is filled to a position where the first groove 20K1 is located by utilizing the good fluidity of the light-shielding layer when the light-shielding layer is not cured, that is, at least part of the light-shielding layer 30 is located in the first groove 20K1, so that a thickness of the light-shielding layer 30 in a region except for the first groove 20K1 may be greatly reduced (in order to clearly illustrate the change in the thickness of the light-shielding layer 30 before the first grooves 20K1 are not provided and after the first grooves 20K1 are provided, a height of the light-shielding layer 30' before the first groove 20K1 is not provided is indicated by a dotted line in FIG. 2, a thickness of the light-shielding layer 30' is H0', a height of the light-shielding layer 30 after the first groove 20K1 is provided is indicated by a solid line in FIG. 2, and at this time, a thickness of the light-shielding layer 30 in the region except for the first groove 20K1 is H0, and H0<H0'), and further, a problem of bonding interference at the time of transfer due to the higher film layer height around the light-emitting components 40 may be improved, the risk of interference between the microstamp and film layers around the light-emitting components 40 in a depression process of using the microstamp to transfer the light-emitting components 40 can be reduced, the transfer efficiency of the light-emitting components 40 and the subsequent binding yield with the binding electrode 201 can be improved, and thus the display quality can be ensured.

It should be noted that, in the drawings of this embodiment, only the structure of the display panel is shown exemplarily. In a specific implementation, the structure of the display panel includes but is not limited to this, and other structures capable of implementing the display function may be included. For details, reference may be made to the structures of the mini LED display panel or the micro LED display panel in the related art, and details are not described here in this embodiment.

Figure 3:
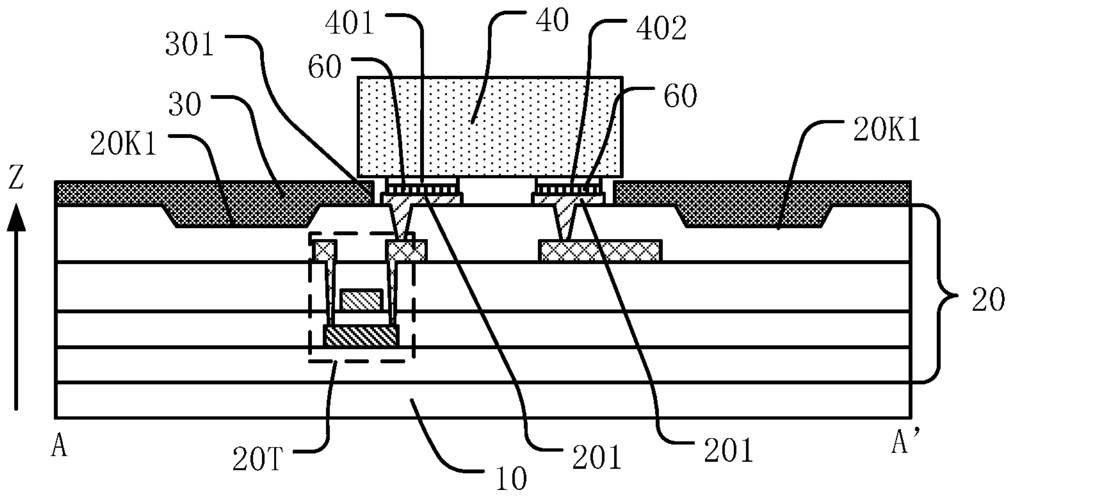
FIG. 3 is another cross-sectional view taken along a direction A-A' of FIG. 1.

In an embodiment, as shown in FIG. 1 and FIG. 3, FIG. 3 is another cross-sectional view taken along a direction A-A' of FIG. 1. With the arrangement of the first groove 20K1, after the thickness of the light shielding layer 30 in the region except for the first groove 20K1 is reduced, the area covered by the light-shielding layer 30 around the light-emitting component 40 may be as large as possible, even so that the orthographic projection of the light-emitting component of the multiple light-emitting components 40 on the substrate 10 at least partially overlaps with the orthographic projection of the light-shielding layer 30 on the substrate, as long as light-shielding layer 30 avoids the binding electrode 201, and further, the shielding area of the light-shielding layer 30 can be increased, the screen reflectivity can be further reduced, and the display quality can be improved more effectively.

It should be understood that in FIG. 3 of this embodiment, a conductive structure 60 such as solder or eutectic layer may be provided between the binding electrode 201 and the cathode 401 and the anode 402 of the light-emitting component 40. When the light-emitting component 40 is transferred, the cathode 401 and the anode 402 of the light-emitting component 40 may correspond to the binding electrode 201 on the display substrate by a microstamp, and the conductive structure 60 such as solder or eutectic layer may be pressed by a depression action of the microstamp, so that the cathode 401 and the anode 402 of the light-emitting component 40 are bonded and electrically connected to the binding electrode 201 on the display substrate.

Figure 4:
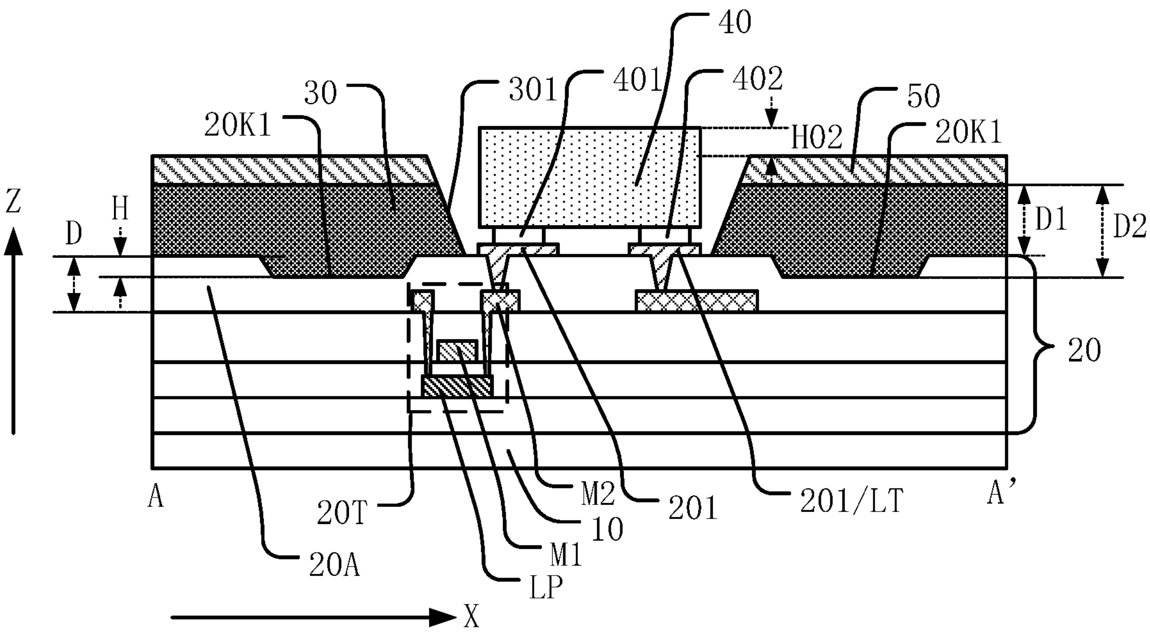
FIG. 4 is another cross-sectional view taken along a direction A-A' of FIG. 1.

In an embodiment, as shown in FIG. 1 and FIG. 4, FIG. 4 is another cross-sectional view taken along a direction A-A' of FIG. 1. In this embodiment, a side of the light-shielding layer 30 facing away from the substrate 10 may further include a protective layer 50, the protective layer may cover a region where the light-shielding layer 30 is located, and the protective layer 50 is used for preventing the light-shielding layer 30 from being corroded by the stripping liquid in a subsequent fabrication process to function to protect the light-shielding layer 30. It should be understood that the stripping liquid is used to strip the photoresist, and the stripping liquid is required when the used negative light-resistance is stripped after the binding electrodes are evaporated in the subsequent fabrication process. Therefore, a fabrication material of the protective layer 50 of this embodiment may be made of an organic film material that is resistant to the stripping liquid, and the protective layer 50 of the organic film material may be used for not only protecting the light-shielding layer 30 and also making both the protective layer 50 and the light-shielding layer 30 be organic materials, whereby a peeling problem between the protective layer 50 and the light-shielding layer 30 is greatly improved. The protective layer 50 may further include an inorganic layer, and the inorganic layer may have a good density to protect the light-shielding layer 30. The protective layer may further include an inorganic layer and an organic layer. The structure in which the first grooves 20K1 are disposed around the light-emitting component 40 in the drive array layer 20 makes the overall thickness of the light-shielding layer 30 and the protective layer 50 thin, thereby effectively reducing the risk of interference with the surrounding film layer during the transfer of the light-emitting component 40, and improving the binding yield.

It should be understood that in this embodiment, after the transfer and bonding of the light-emitting component 40 is completed by means of microstamp transfer, the first groove 20K1 is disposed in the drive array layer 20, so that the height of the film layer around the light-emitting component 40 is reduced, whereby it can be effectively ensured that, after the binding bonding, a distance H02 between an upper surface of the light-emitting component 40 and an upper surface of the protective layer 50 in the direction Z perpendicular to the plane where the substrate 10 is located is greater than or equal to 2 μm (as shown in FIG. 4), and further, the thickness of the light-shielding layer 30 in the region except for the first groove 20K1 can be greatly reduced. After the protective layer 50 is subsequently fabricated, a height of the protective layer 50 on the substrate 10 relative to the light-emitting component 40 is greatly reduced, a problem of bonding interference at the time of transfer due to the higher film layer height around the light-emitting components 40 may be improved, the risk of micro-stamps interfering with the upper surface of the protective layer 50 around the light-emitting component 40 in a depression process of using the microstamp to transfer the light-emitting components 40 can be effectively reduced, and further, the transfer efficiency of the light-emitting components 40 and the subsequent binding yield with the binding electrode 201 can be improved, and thus the display quality can be ensured.

It should be noted that the width of the first groove 20K1 in the direction Z perpendicular to the plane where the substrate 10 is located is not specifically limited in this embodiment. In a specific implementation, the accommodating space of the first groove 20K1 may be reasonably set according to the thickness of the desired light-shielding layer 30, so that the distance H02 between the upper surface of the light-emitting component 40 and the upper surface of the protective layer 50 in the direction Z perpendicular to the plane where the substrate 10 is located after the light-emitting component 40 is bound and bonded is greater than or equal to 2 μm, and details are not described here in this embodiment.

In some optional embodiments, with continued reference to FIGS. 1 and 4, in this embodiment, at least part of the light-shielding layer 30 is located within the first grooves 20K1, and at least part of the light-shielding layer 30 is located outside the first grooves 20K1. Outside a region where the multiple first grooves 20K1 are located, a thickness of the light-shielding layer 30 in a direction Z perpendicular to a plane where the substrate 10 is located is D1; and in the region where the multiple first grooves 20K1 are located, a thickness of the light-shielding layer 30 in the direction Z perpendicular to the plane where the substrate 10 is located is D2, where D1<D2.

This embodiment illustrates that: the first groove 20K1 is provided in a certain film layer or certain more film layers in the drive array layer 20 of the display panel 000, so that the first groove 20K1 is at least partially disposed around the first opening 301 of the light-shielding layer 30, the drive array layer 20 is sunk at a certain distance at a position of the first groove 20K1, at least part of the light-shielding layer 30 is filled in the first groove 20K1, while at least part of the light-shielding layer 30 is located outside the first groove 20K1, and the thickness D1 of the light-shielding layer 30 outside the first groove 20K1 in the direction Z perpendicular to the plane where the substrate 10 is located is less than the thickness D2 of the light-shielding layer 30 in the first groove 20K1 region in the direction Z perpendicular to the plane where the substrate 10 is located, whereby the light-shielding layer 30 maintains a whole structure in the region except for the first opening 301, thereby ensuring the light-shielding performance.

In an embodiment, with continued reference to FIGS. 1 and 4, at least part of the light-emitting layer 30 is located on a side of a first groove of the multiple first grooves 20K1 facing to a respective one of the multiple light-emitting components 40.

This embodiment illustrates that when at least part of the light-shielding layer 30 is located in the region except for the first groove 20K1, the light-shielding layer 30 is disposed not only on a side of the first groove 20K1 facing away from the light-emitting component 40, it is also ensured that the side of the first groove 20K1 facing to the light-emitting component 40 is also at least partially provided with the light-shielding layer 30, that is, the orthographic projection of the light-shielding layer 30 on the plane where the substrate 10 is located is at least partially located between the orthographic projection of the first groove 20K1 on the plane where the substrate 10 is located and the orthographic projection of the light-emitting component 40 on the plane where the substrate 10 is located, which is equivalent to further increasing the shielding area of the light-shielding layer 30 to achieve the better light-shielding effect, while further improving the display quality of the display panel 000.

Figure 5:
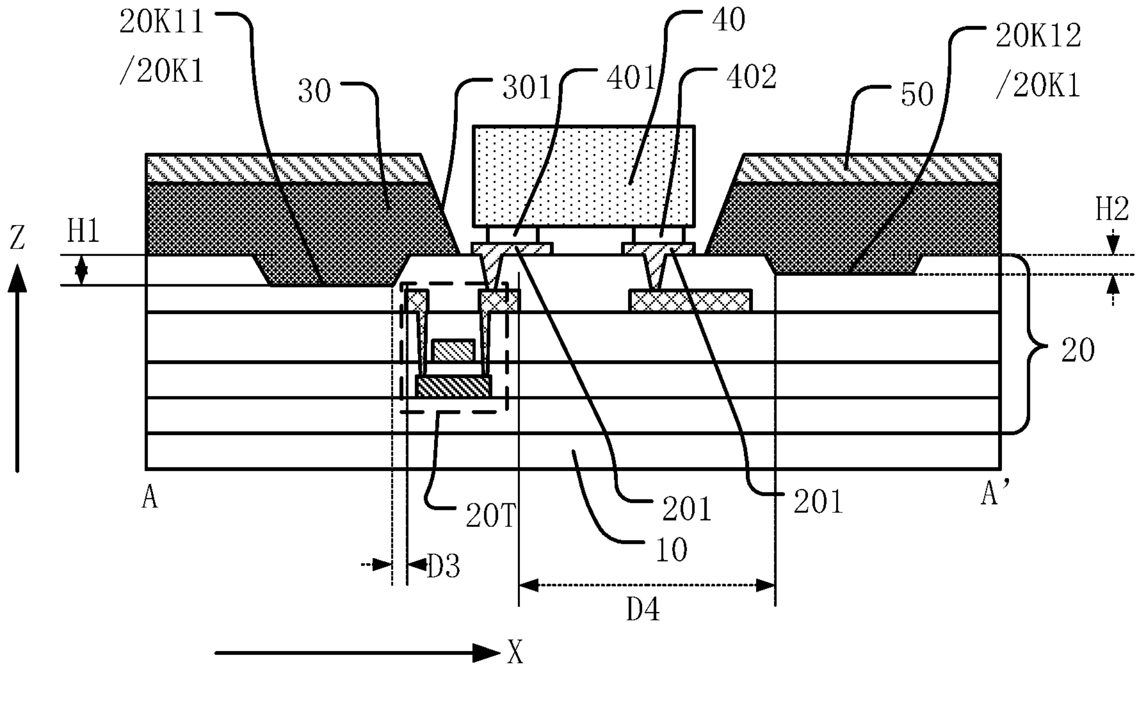
FIG. 5 is another cross-sectional view taken along a direction A-A' of FIG. 1.
Figure 6:
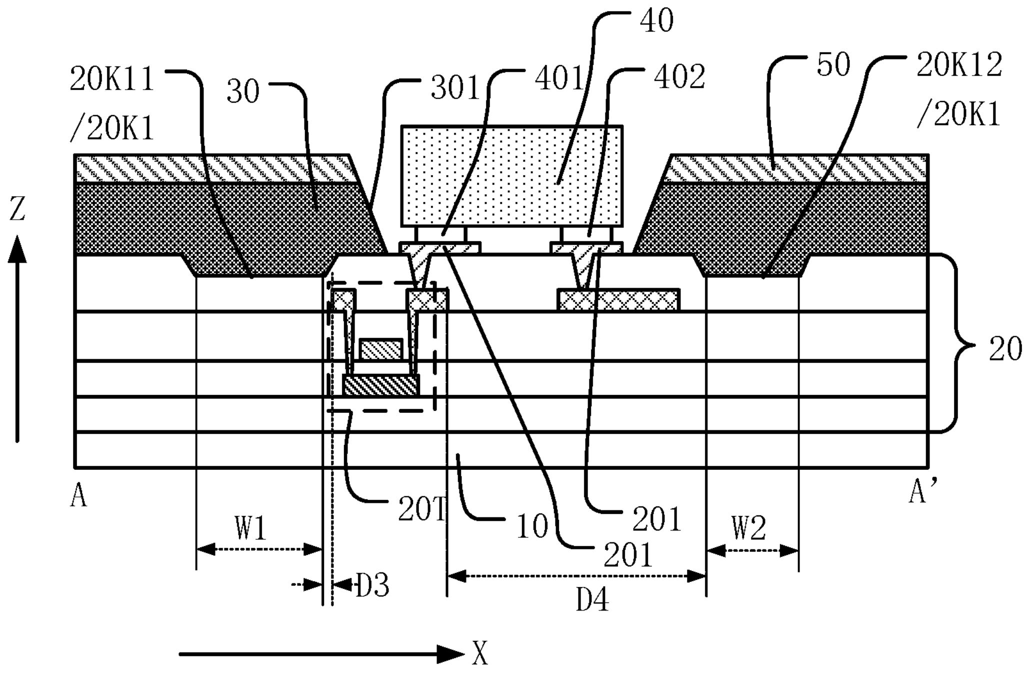
FIG. 6 is another cross-sectional view taken along a direction A-A' of FIG. 1.
Figure 7:
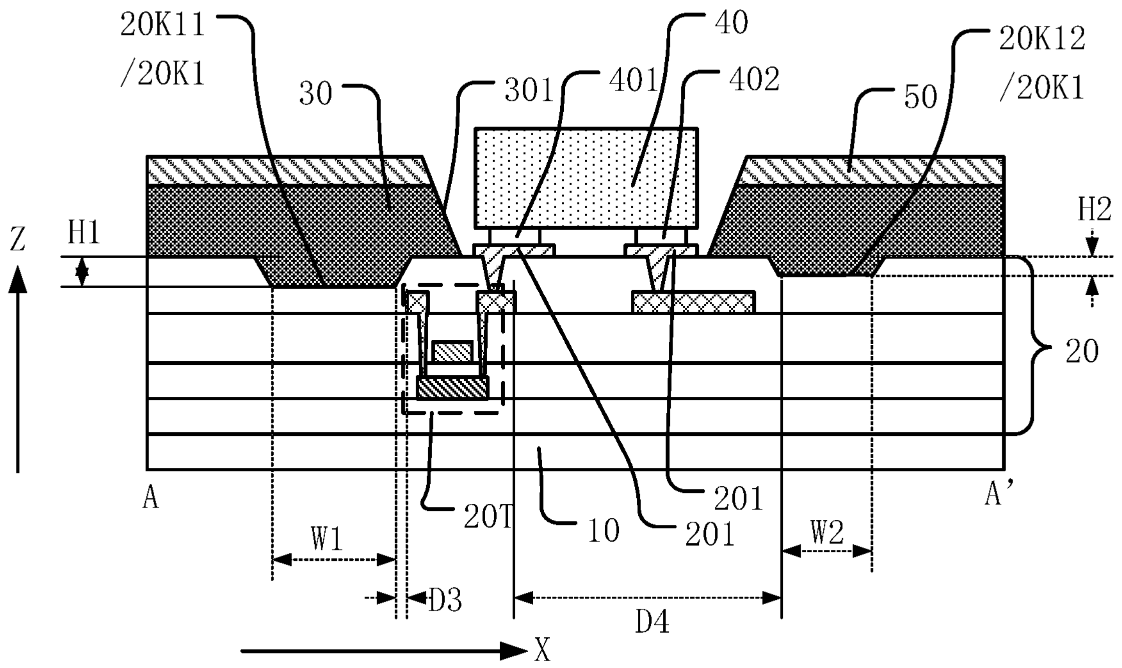
FIG. 7 is another cross-sectional view taken along a direction A-A' of FIG. 1.

In some optional embodiments, reference is made to FIG. 1 and FIGS. 5 to 7, FIG. 5 is another cross-sectional view taken along a direction A-A' of FIG. 1, FIG. 6 is another cross-sectional view taken along a direction A-A' of FIG. 1, and FIG. 7 is another cross-sectional view taken along a direction A-A' of FIG. 1. In this embodiment, a same first groove 20K1 disposed at least partially around the first opening 301 includes a first portion 20K11 and a second portion 20K12, and in a direction Z perpendicular to a plane where the substrate 10 is located, a depth H1 of the first portion 20K11 is different from a depth H2 of the second portion 20K12; or in a direction parallel to a plane where the substrate 10 is located and along a direction (the first direction X shown in the drawings) in which the same first groove 20K1 is directed towards the light-emitting component 40, a width W1 of the first portion 20K11 is different from a width W2 of the second portion 20K12.

This embodiment illustrates that the same first groove 20K1 disposed at least partially around the first opening 301 may be differentially designed at different positions, and the same first groove 20K1 may include the first portion 20K11 and the second portion 20K12. The first portion 20K11 and the second portion 20K12 may be located at different positions around the same light-emitting component 40, and the first portion 20K11 and the second portion 20K12 may be two portions of the same first groove 20K1 communicating with each other, or the first portion 20K11 and the second portion 20K12 may be two portions of the same first groove 20K1 not communicating with each other. This embodiment is not limited thereto, it is only necessary to satisfy that the same first groove 20K1 disposed at least partially around the first opening 301 includes the first portion 20K11 and the second portion 20K12 located at different positions.

As shown in FIGS. 1 and 5, in the direction Z perpendicular to the plane where the substrate 10 is located, the depth H1 of the first portion 20K11 is different from the depth H2 of the second portion 20K12. At this time, in the direction parallel to the plane where the substrate 10 is located, the width W1 of the first portion 20K11 may be the same as the width W2 of the second portion 20K12 along the direction (the first direction X shown in the drawings) in which the first grooves 20K1 are directed towards the light-emitting components 40, so that a depth of the first groove 20K1 at a part of region may be made deeper to increase the space for accommodating the light-shielding layer 30 at this position, thereby enhancing the light-shielding performance at deeper positions.

As shown in FIGS. 1 and 6, in the direction parallel to the plane where the substrate 10 is located and along the direction (the first direction X shown in the drawings) in which the first grooves 20K1 are directed towards the light-emitting components 40, a width W1 of the first portion 20K12 is different from a width W2 of the second portion 20K12. At this time, the depth H1 of the first portion 20K11 may be the same as the depth H2 of the second portion 20K12 in the direction Z perpendicular to the plane where the substrate 10 is located, so that a width of the first groove 20K1 at a part of region may be made wider to increase the space for accommodating the light-shielding layer 30 at this position, thereby enhancing the light-shielding performance at wider positions.

As shown in FIGS. 1 and 7, in the direction Z perpendicular to the plane where the substrate 10 is located, the depth H1 of the first portion 20K11 is different from the depth H2 of the second portion 20K12. In the direction parallel to the plane where the substrate 10 is located and along the direction (the first direction X shown in the drawings) in which the first grooves 20K1 are directed towards the light-emitting components 40, the width W1 of the first portion 20K11 is different from the width W2 of the second portion 20K12, so that a width of the first groove 20K1 at a part of region may be made wider and a depth of the first groove 20K1 at a part of region may be made deeper to more increase the space for accommodating the light-shielding layer 30 at this position, thereby enhancing the light-shielding performance at this position.

Figure 8:
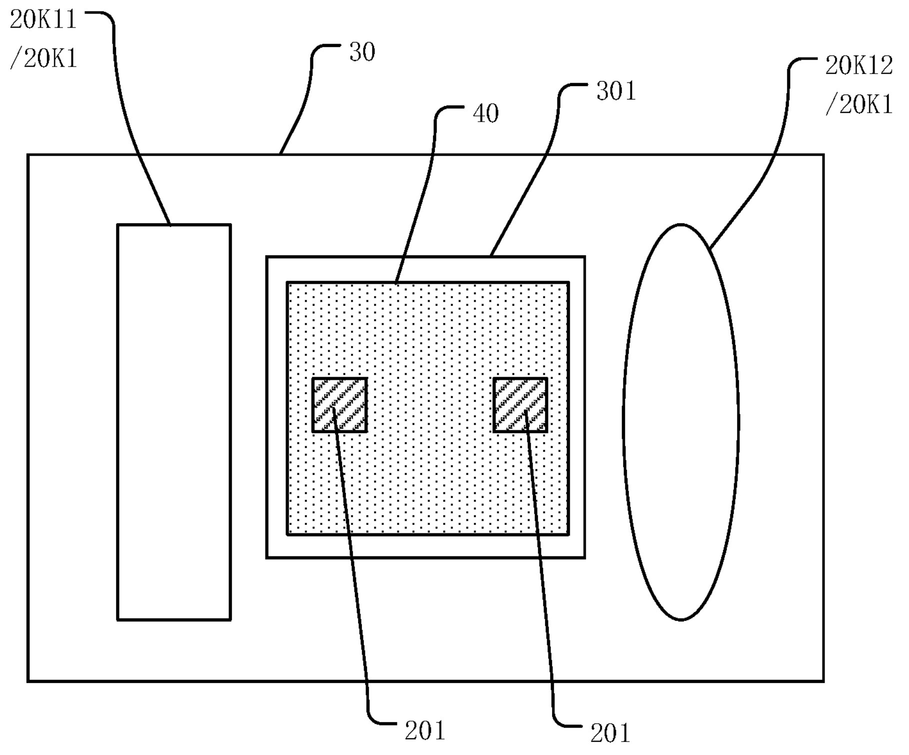
FIG. 8 is a partial plan view of a first groove position in FIG. 5.

In an embodiment, as shown in FIG. 1, FIG. 5 and FIG. 8, FIG. 8 is a partial plan view of a first groove position in FIG. 5 (it should be understood that the transparent filling is performed in FIG. 8 in order to clearly illustrate the structure of this embodiment). In this embodiment, the same first groove 20K1 disposed at least partially around the first opening 301 includes the first portion 20K11 and the second portion 20K12. The first portion 20K11 and the second portion 20K12 may be understood to be located at different positions around the same light-emitting component 40, and the first portion 20K11 and the second portion 20K12 may be two portions of the same first groove 20K1 communicating with each other, or the first portion 20K11 and the second portion 20K12 may be two portions of the same first groove 20K1 not communicating with each other. A shape of the orthographic projection of the first portion 20K11 on the plane where the substrate 10 is located may be disposed to be different from a shape of the orthographic projection of the second portion 20K12 on the plane where the substrate 10 is located. For example, the shape of the orthographic projection of the first portion 20K11 on the plane where the substrate 10 is located may be a rectangular bar, the shape of the orthographic projection of the second portion 20K12 on the plane where the substrate 10 is located may be an elliptical bar (as shown in FIG. 8), or the shape of the orthographic projection of the first portion 20K11 on the plane where the substrate 10 is located may be an elliptical bar, the shape of the orthographic projection of the second portion 20K12 on the plane where the substrate 10 is located may be a rectangular bar, or the shape of the orthographic projection of the first portion 20K11 on the plane where the substrate 10 is located may be a rectangular bar, and the shape of the orthographic projection of the second portion 20K12 on the plane where the substrate 10 is located may be a non-rectangular strip-like structure, so that when the first groove 20K including the first portion 20K11 and the second portion 20K12 is provided in the drive array layer 20, the shape of the first groove 20K1 is flexibly designed to enable any one of the first portion 20K11 or the second portion 20K12 to be avoided structures such as alignment marks in the display panel 000, whereby the provision of the first groove 20K1 is prevented from affecting the function of the display panel 000 itself.

In an embodiment, as shown in FIG. 1 and FIGS. 5 to 7, in the direction parallel to the plane where the substrate 10 is located and along the direction (the first direction X shown in the drawings) in which the first grooves 20K1 are directed towards the light-emitting components 40, the width W1 of the first portion 20K11 is greater than the width W2 of the second portion 20K12, and/or in the direction Z perpendicular to the plane where the substrate 10 is located, the depth H1 of the first portion 20 K11 is greater than the depth H2 of the second portion 20K12; the drive array layer 20 includes multiple thin film transistors 20T, a distance between an orthographic projection of the first portion 20K11 on the substrate 10 and an orthographic projection of a thin film transistor of the multiple thin film transistors 20T on the substrate 10 is D3, and a distance between an orthographic projection of the second portion 20K12 on the substrate 10 and the orthographic projection of the thin film transistor 20T on the substrate 10 is D4, where D3<D4.

This embodiment illustrates that the same first groove 20K1 disposed at least partially around the first opening 301 may be differentially designed in depth and width at different positions, as shown in FIG. 6, the width W1 of the first portion 20K11 is greater than the width W2 of the second portion 20K12 along the direction (the first direction X shown in the drawings) in which the first grooves 20K1 are directed towards the light-emitting components 40; or as shown in FIG. 5, the depth H1 of the first portion 20K11 may be greater than the depth H2 of the second portion 20K12 in the direction Z perpendicular to the plane where the substrate 10 is located; or as shown in FIG. 7, the width W1 of the first portion 20K11 is greater than the width W2 of the second portion 20K12 along the direction (the first direction X shown in the drawings) in which the first grooves 20K1 are directed towards the light-emitting components 40, and the depth H1 of the first portion 20K11 is greater than the depth H2 of the second portion 20K12 in the direction Z perpendicular to the plane where the substrate 10 is located. The drive array layer 20 includes multiple thin film transistors 20T, a distance D3 between an orthographic projection of the first portion 20K11 on the substrate 10 and an orthographic projection of each of the multiple thin film transistors 20T on the substrate 10 is less than a distance D4 between an orthographic projection of the second portion 20K12 on the substrate 10 and the orthographic projection of the each of the multiple thin film transistors 20T on the substrate 10, that is, compared with the second portion 20K12 having a narrower width, the first portion 20K11 having a wider width is closer to the thin film transistor 20T in the direction X parallel to the plane where the substrate 10 is located, and compared with the second portion 20K12 having a shallower depth, the first portion 20K11 having a deeper depth is closer to the thin film transistor 20T so that the closer to the thin film transistor 20T, the wider the width of the first groove 20K1, or the closer to the thin film transistor 20T, the deeper the depth of the first groove 20K1, or the closer to the thin film transistor 20T, the wider the width and the deeper the depth of the first groove 20K1, the larger the space accommodating the light-shielding layer 30, whereby it is advantageous to enhance the light-shielding performance at the position of the thin film transistor 20T, thereby effectively functioning to protect the thin film transistor 20T, avoiding the problem that the light rays being irradiated the thin film transistor 20T easily generate the leakage current, and achieving the effect of reducing the light leakage current.

It should be understood that the distance D3 between the orthographic projection of the first portion 20K11 on the substrate 10 and the orthographic projection of the thin film transistor 20T on the substrate 10 in this embodiment may be a shortest distance between the orthographic projection of the first portion 20K11 on the substrate 10 and the orthographic projection of the thin film transistor 20T on the substrate 10 in the direction parallel to the plane where the substrate 10 is located, as shown in FIGS. 5 to 7, the distance D4 between the orthographic projection of the second portion 20K12 on the substrate 10 and the orthographic projection of the thin film transistor 20T on the substrate 10 may be a shortest distance between the orthographic projection of the second portion 20K12 on the substrate 10 and the orthographic projection of the thin film transistor 20T on the substrate 10 in the direction parallel to the plane where the substrate 10 is located, as shown in FIGS. 5 to 7.

Figure 9:
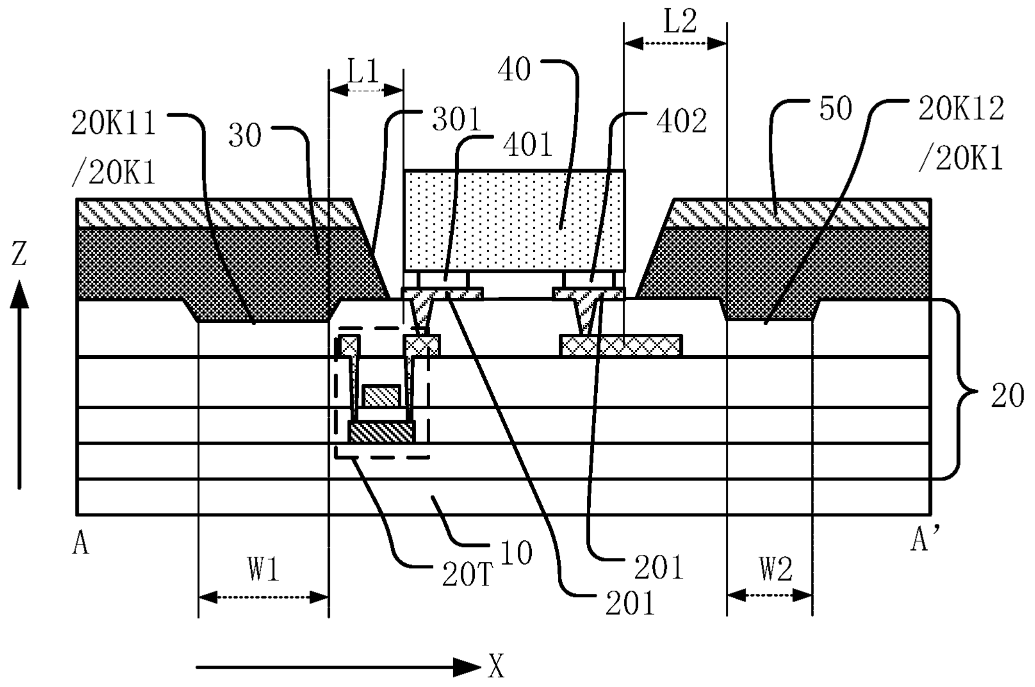
FIG. 9 is another cross-sectional view taken along a direction A-A' of FIG. 1.
Figure 10:
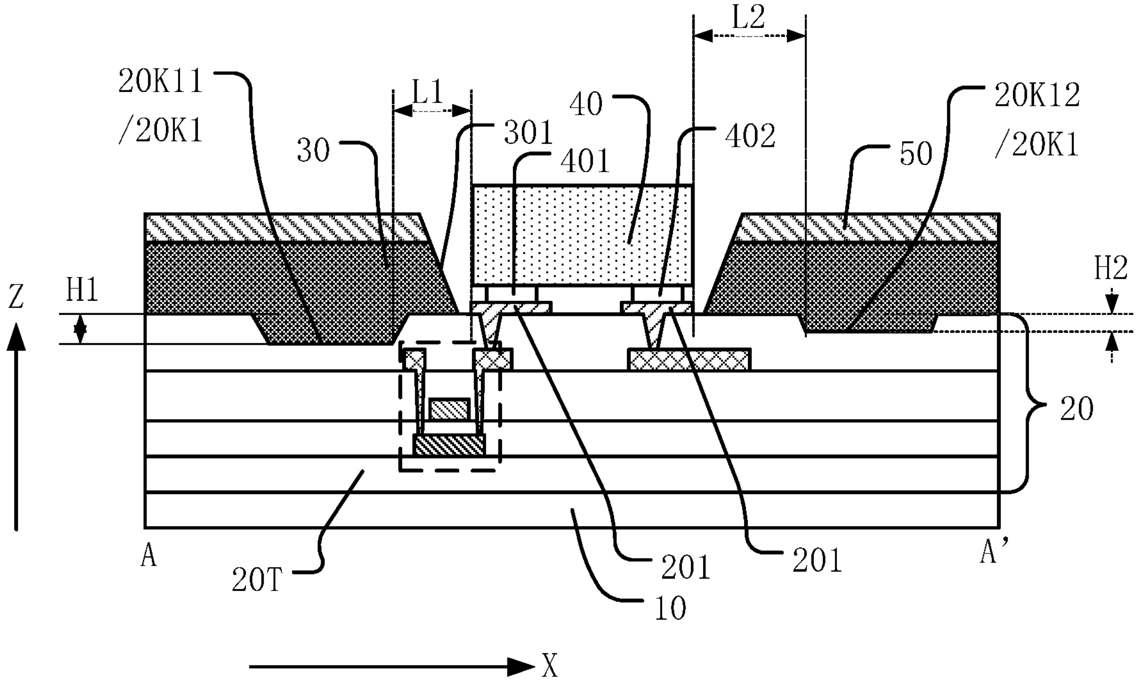
FIG. 10 is another cross-sectional view taken along a direction A-A' of FIG. 1.
Figure 11:
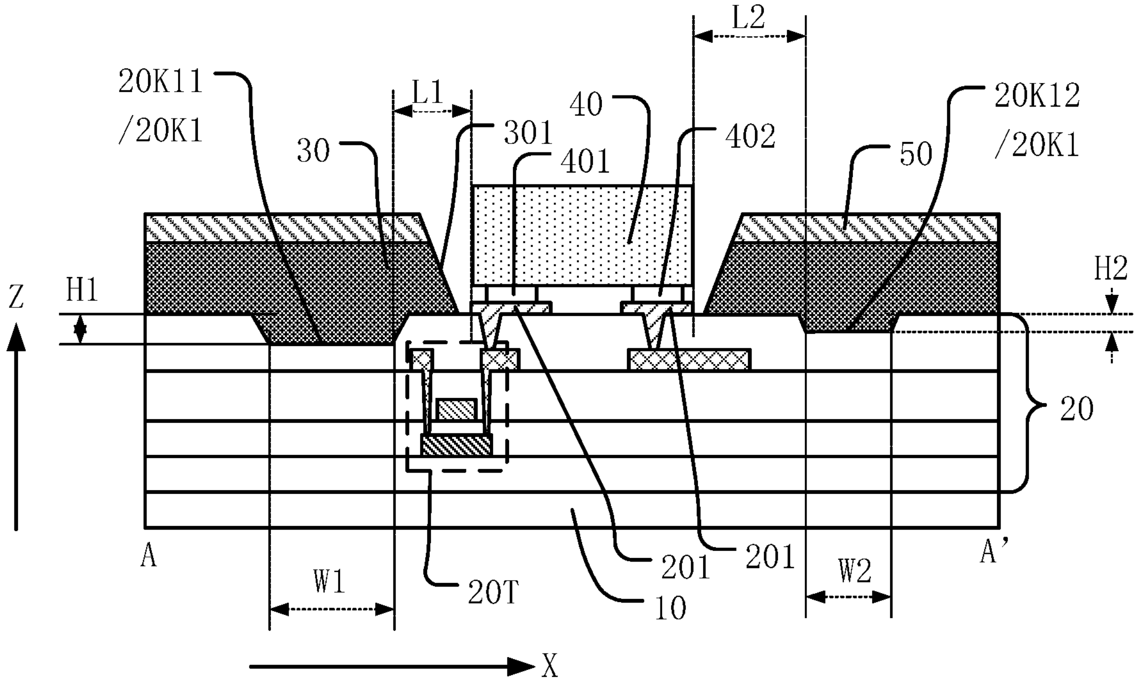
FIG. 11 is another cross-sectional view taken along a direction A-A' of FIG. 1.

In some optional embodiments, reference is made to FIG. 1 and FIGS. 9 to 11. FIG. 9 is another cross-sectional view taken along a direction A-A' of FIG. 1, FIG. 10 is another cross-sectional view taken along a direction A-A' of FIG. 1, and FIG. 11 is another cross-sectional view taken along a direction A-A' of FIG. 1. In this embodiment, in the direction parallel to the plane where the substrate 10 is located, a shortest distance from the first portion 20K11 to the light-emitting component 40 is L1, and a shortest distance from the second portion 20K12 to the light-emitting component 40 is L2. It should be understood that the shortest distance from the first portion 20K11 to the light-emitting component 40 may be understood as a distance from a side edge closest to the light-emitting component 40 of the first portion 20K11 to a side edge closest to the first portion 20K11 of the light-emitting component 40 in the direction parallel to the plane where the substrate 10 is located, and the shortest distance from the second portion 20K12 to the light-emitting component 40 may be understood as the distance from a side edge closest to the light-emitting component 40 of the second portion 20K12 to a side edge closest to the second portion 20K12 of the light-emitting component 40 in the direction parallel to the plane where the substrate 10 is located. In the direction parallel to the plane where the substrate 10 is located and along the direction (the first direction X shown in the drawings) in which the first groove 20K1 is directed towards the light-emitting component 40, the width of the first portion 20K11 is W1, and the width of the second portion 20K12 is W2. In the direction Z perpendicular to the plane where the substrate 10 is located, the depth of the first portion 20K11 is H1, and the depth of the second portion 20K12 is H2, where (L1−L2)×(W1−W2)<0, and/or (L1−L2)×(H1−H2)<0.

This embodiment illustrates that the same first groove 20K1 disposed at least partially around the first opening 301 may be differentially designed at different positions, and the same first groove 20K1 may include the first portion 20K11 and the second portion 20K12. The first portion 20K11 and the second portion 20K12 may be located at different positions around the same light-emitting component 40, and the first portion 20K11 and the second portion 20K12 may be two portions of the same first groove 20K1 communicating with each other, or the first portion 20K11 and the second portion 20K12 may be two portions of the same first groove 20K1 not communicating with each other. This embodiment is not limited thereto, it is only necessary to satisfy that the same first groove 20K1 disposed at least partially around the first opening 301 includes the first portion 20K11 and the second portion 20K12 located at different positions, and that the depth and/or width of the first portion 20K11 and the depth and/or width of the second portion 20K12 may be differently designed.

As shown in FIGS. 1 and 9, in the direction parallel to the plane where the substrate 10 is located, the shortest distance from the first portion 20K11 to the light-emitting component 40 is L1, and the shortest distance from the second portion 20K12 to the light-emitting component 40 is L2. In the direction parallel to the plane where the substrate 10 is located and along the direction (the first direction X shown in the drawings) in which the first groove 20K1 is directed towards the light-emitting component 40, the width of the first portion 20K11 is W1, and the width of the second portion 20K12 is W2, where (L1−L2)×(W1−W2)<0. That is, if L1>L2, then W1<W2 (not shown in the drawings), and if L1<L2, then W1>W2 (as shown in FIG. 9), so that the width of the first groove 20K1 closer to a part of the region of the light-emitting component 40 in the first direction X becomes wider, so as to increase the space in this position for accommodating the light-shielding layer 30, enhance the light-shielding performance at a wider position, facilitate enhancing the light-shielding performance at a position near the light-emitting component 40, effectively reduce the reflectivity at the position near the light-emitting component 40, and facilitate the further improvement of the display quality.

As shown in FIGS. 1 and 10, in the direction parallel to the plane where the substrate 10 is located, the shortest distance from the first portion 20K11 to the light-emitting component 40 is L1, and the shortest distance from the second portion 20K12 to the light-emitting component 40 is L2. In the direction Z perpendicular to the plane where the substrate 10 is located, the depth of the first portion 20K11 is H1, and the depth of the second portion 20K12 is H2, where (L1−L2)×(H1−H2)<0, that is, if L1>L2, then H1<H2 (not shown in the drawings), and if L1<L2, then H1>H2 (as shown in FIG. 10), so that the depth of the first groove 20K1 closer to a part of the region of the light-emitting component 40 in the first direction X becomes deeper, so as to increase the space in this position for accommodating the light-shielding layer 30, enhance the light-shielding performance at a deeper position, facilitate enhancing the light-shielding performance at a position near the light-emitting component 40, effectively reduce the reflectivity at the position near the light-emitting component 40, and facilitate the further improvement of the display quality.

As shown in FIGS. 1 and 11, in the direction parallel to the plane where the substrate 10 is located, the shortest distance from the first portion 20K11 to the light-emitting component 40 is L1, and the shortest distance from the second portion 20K12 to the light-emitting component 40 is L2. In the direction parallel to the plane where the substrate 10 is located and along the direction (the first direction X shown in the drawings) in which the first groove 20K1 is directed towards the light-emitting component 40, the width of the first portion 20K11 is W1, and the width of the second portion 20K12 is W2. In the direction Z perpendicular to the plane where the substrate 10 is located, the depth of the first portion 20K11 is H1, and the depth of the second portion 20K12 is H2, where (L1−L2)×(W1−W2)<0 and (L1−L2)×(H1−H2)<0, that is, if L1>L2, then W1<W2 and H1<H2 (not shown in the drawings), if L1<L2, then W1>W2 and H1>H2 (as shown in FIG. 11), so that the width of the first groove 20K1 closer to a part of the region of the light-emitting component 40 in the first direction X becomes wider, the depth of the first groove 20K1 closer to a part of the region of the light-emitting component 40 in the first direction X becomes deeper, so as to increase the space in this position for accommodating the light-shielding layer 30, facilitate enhancing the light-shielding performance at a position near the light-emitting component 40, further effectively reduce the reflectivity at the position near the light-emitting component 40, and facilitate the further improvement of the display quality.

Figure 12:
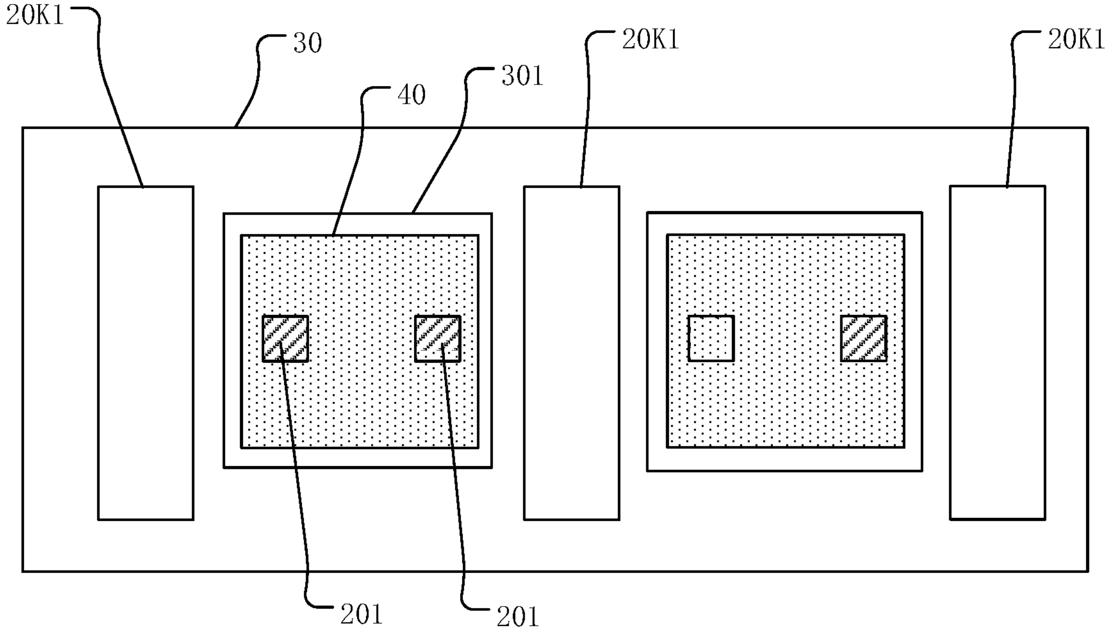
FIG. 12 is a partial plan view of a first groove of a part of regions where a light-emitting component is located in FIG. 1.
Figure 13:
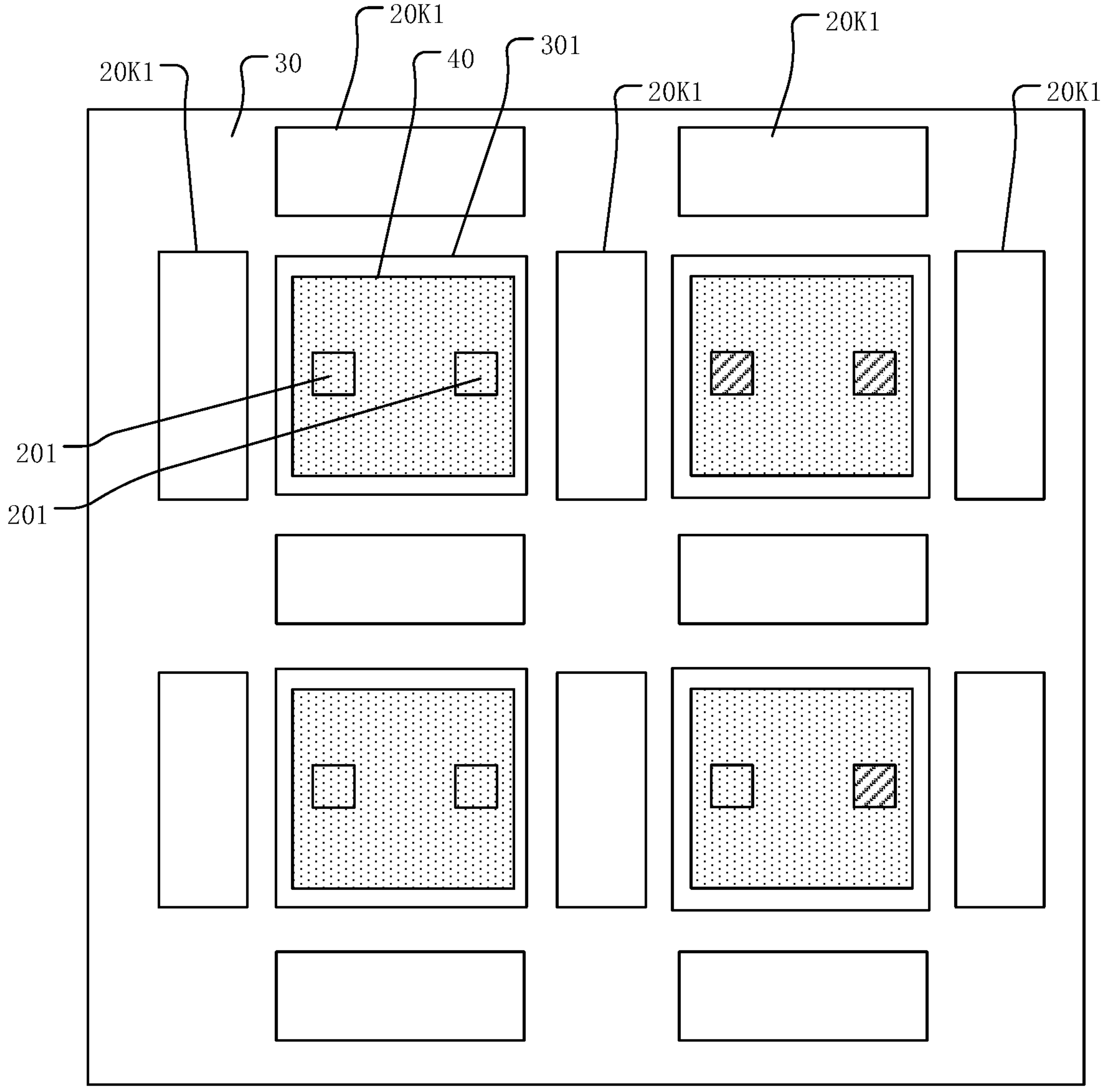
FIG. 13 is another partial plan view of a first groove of a part of regions where a light-emitting component is located in FIG. 1.

In some optional embodiments, reference is made to FIG. 1, FIG. 12 and FIG. 13, FIG. 12 is a partial plan view of a first groove of a part of regions where a light-emitting component is located in FIG. 1, FIG. 13 is another partial plan view of a first groove of a part of regions where a light-emitting component is located in FIG. 1 (it should be understood that the transparent filling is performed in FIGS. 12 and 13 in order to clearly illustrate the structure of this embodiment). In this embodiment, the orthographic projection of the first groove 20K1 on the substrate 10 is a strip-like structure, and the first groove of the multiple first grooves 20K1 is located between two adjacent light-emitting components 40 in a direction parallel to a plane where the substrate 10 is located.

This embodiment illustrates that the first grooves 20K1 provided in the drive array layer 20 and at least partially surrounding the first opening 301 may be multiple independent strip-like structures, as shown in FIG. 12, in the direction parallel to the plane where the substrate 10 is located (in a transverse direction in FIG. 12), and the first grooves 20K1 of the strip-like structures may be independently located between two adjacent light-emitting components 40, respectively. Or, as shown in FIG. 13, in the direction parallel to the plane where the substrate 10 is located, the first grooves 20K1 of the strip-like structure may be independently located between two adjacent light-emitting components 40 (in a transverse direction and a longitudinal direction in FIG. 13). In this embodiment, the first groove 20K1 provided in the drive array layer 20 is designed to be an independent strip-like structure between two adjacent light-emitting components 40, and the strip-like first grooves 20K1 may be provided in a position where the light-shielding performance needs to be enhanced, so that the first groove 20K1 for filling the light-shielding layer 30 may be disposed around the light-emitting component 40 more flexibly to ensure that the light-emitting component 40 does not interfere with the film layer such as the light-shielding layer 30 on the substrate when being transferred, and the light-shielding effect at the desired position may be flexibly improved by the first grooves 20K1 provided around the light-emitting component 40 in the light-shielding layer 30.

Figure 14:
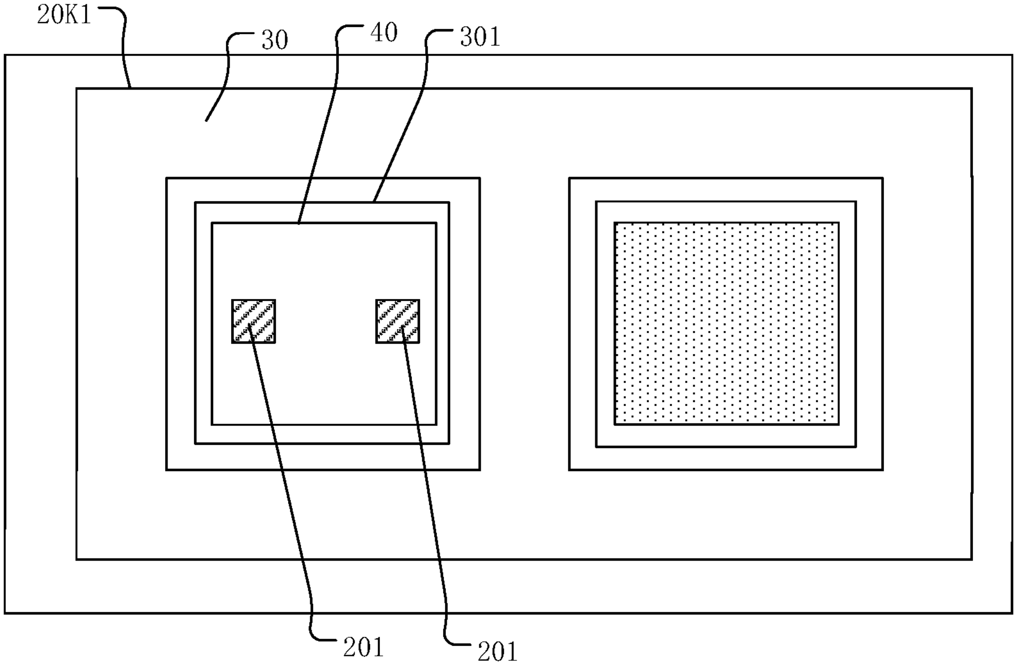
FIG. 14 is another partial plan view of a first groove of a part of regions where a light-emitting component is located in FIG. 1.
Figure 15:
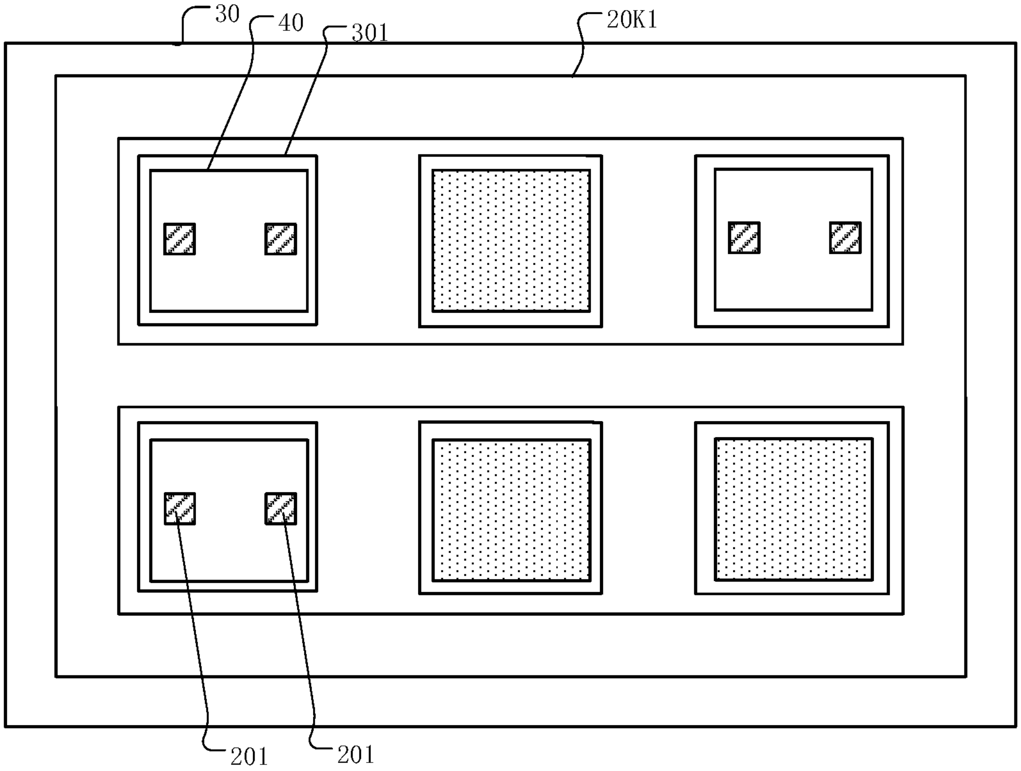
FIG. 15 is another partial plan view of a first groove of a part of regions where a light-emitting component is located in FIG. 1.

In some optional embodiments, reference is made to FIGS. 1, 14 and 15, FIG. 14 is another partial plan view of a first groove of a part of regions where a light-emitting component is located in FIG. 1, FIG. 15 is another partial plan view of a first groove of a part of regions where a light-emitting component is located in FIG. 1 (it should be understood that the transparent filling is performed in FIGS. 14 and 15 in order to clearly illustrate the structure of this embodiment). In this embodiment, the orthographic projection of the first groove 20K1 on the substrate 10 is an annular structure, and the orthographic projection of the first groove 20K1 on the substrate 10 surrounds the orthographic projection of the at least one light-emitting component 40 on the substrate 10.

This embodiment illustrates that the first groove 20K1 provided in the drive array layer 20 and at least partially surrounding the first opening 301 may be the annular structure, that is, a shape of the orthographic projection of the first groove 20K1 on the substrate 10 is annular. The orthographic projection of the annular first groove 20K1 on the substrate 10 may surround the orthographic projection of one light-emitting component 40 on the substrate 10. The orthographic projection of the annular first groove 20K1 on the substrate 10 may be surround an orthographic projection of a respective light-emitting component of multiple light-emitting components 40 on the substrate 10 (as shown in FIG. 15, an orthographic projection of one annular first groove 20K1 on the substrate 10 may surround three light-emitting components 40). For example, the multiple light-emitting components 40 included in the display panel 000 may include three light-emitting components 40 of different colors, and each of the three light-emitting components 40 of different colors may form a group, so that an orthographic projection of one annular first groove 20K1 on the substrate 10 may be disposed around the three light-emitting components 40 of different colors. In the transfer fabrication process of the light-emitting component 40, the three light-emitting components 40 of different colors may be transferred to the display substrate together by a microstamp. At this time, the first grooves 20K1 provided around the three light-emitting components 40 of different colors can improve the interference problem in the transfer process, ensure the transfer efficiency and the binding yield, reduce the difficulty in the fabrication process of providing the first groove 20K1 in the drive array layer 20, and thus improve the fabrication process efficiency.

Figure 16:
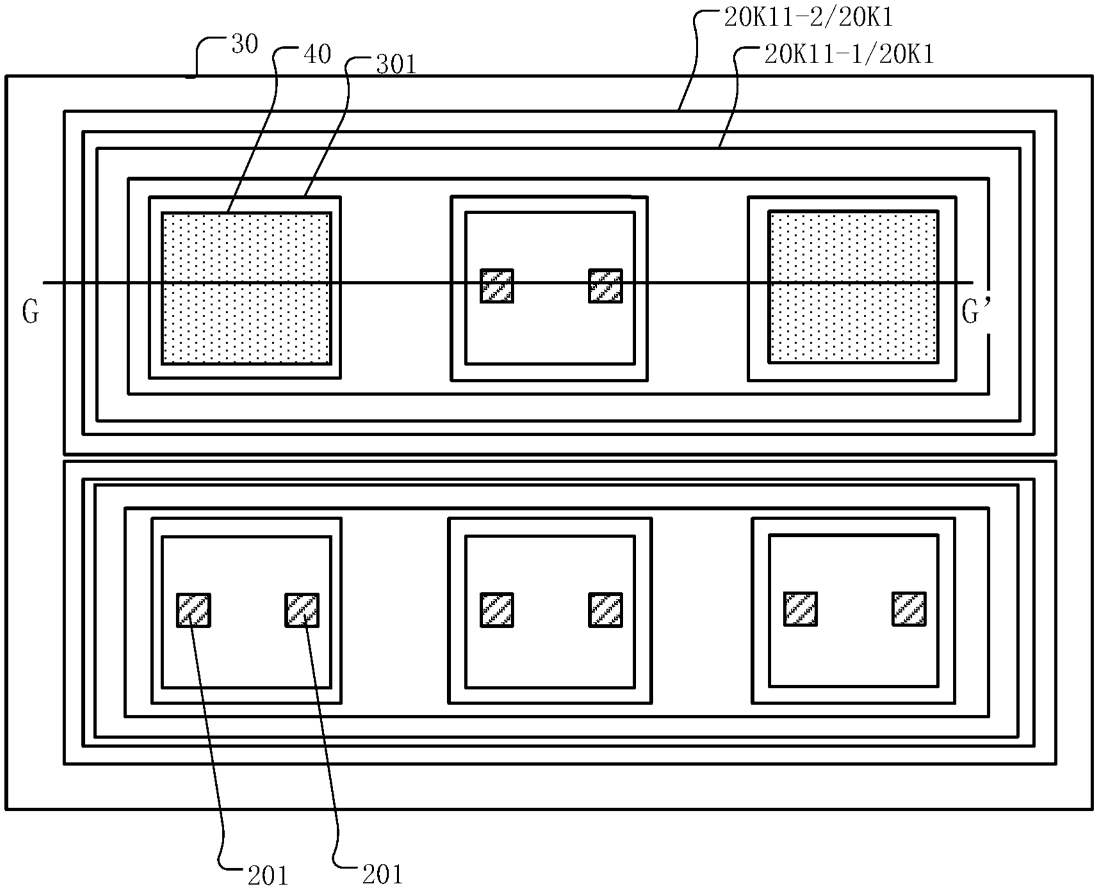
FIG. 16 is another partial plan view of a first groove of a part of regions where a light-emitting component is located in FIG. 1.

In an embodiment, reference is made to FIG. 1 and FIG. 16, FIG. 16 is another partial plan view of a first groove of a part of regions where a light-emitting component is located in FIG. 1 (it should be understood that the transparent filling is performed in FIG. 16 in order to clearly illustrate the structure of this embodiment). The first groove 20K1 in this embodiment may include multiple sub-grooves, in FIG. 16 of this embodiment, an example in which the first groove 20K1 may include two sub-grooves is used for exemplary description, and the two sub-grooves are a third sub-groove 20K11-1 and a fourth sub-groove 20K11-2. An orthographic projection of the third sub-groove 20K11-1 on the substrate 10 surround an orthographic projection of at least one light-emitting component 40 (three light-emitting components 40 in FIG. 16) on the substrate 10, and the fourth sub-groove 20K11-2 further surrounds a periphery of the third sub-groove 20K11-1 facing away from the three light-emitting components 40, that is, the periphery of the at least one light-emitting component 40 may be provided with at least two sub-grooves together to form the first groove 20K1, whereby the space for accommodating the filling of the light-shielding layer 30 may be further increased, the interference problem in the transfer process may be improved, and thus the transfer efficiency and the binding yield are ensured.

It should be understood that in FIG. 16 of this embodiment, only an example in which two sub-grooves are disposed at the periphery of at least one light-emitting component 40 to form the first groove 20K1 is used for exemplary description. In a specific implementation, a number of the sub-grooves disposed at the periphery of the at least one light-emitting component 40 may be three or more, and details are not described here in this embodiment.

It should be understood that, in this embodiment, at least two sub-grooves are disposed at the periphery of the at least one light-emitting component 40 together to form the first groove 20K1, and the third sub-groove 20K11-1 and the fourth sub-groove 20K11-2 may be provided in a structure that is not continuous with each other, as shown in FIG. 16, a space exists between the third sub-groove 20K11-1 and the fourth sub-groove 20K11-2. In other some optional embodiments, the at least two sub-grooves forming the first groove 20K1 such as the third sub-groove 20K11-1 and the fourth sub-groove 20K11-2 may be in a continuous configuration, that is, the direct communication between the third sub-groove 20K11-1 and the fourth sub-groove 20K11-2 may be provided to increase the width of the first groove 20K1.

Figure 17:
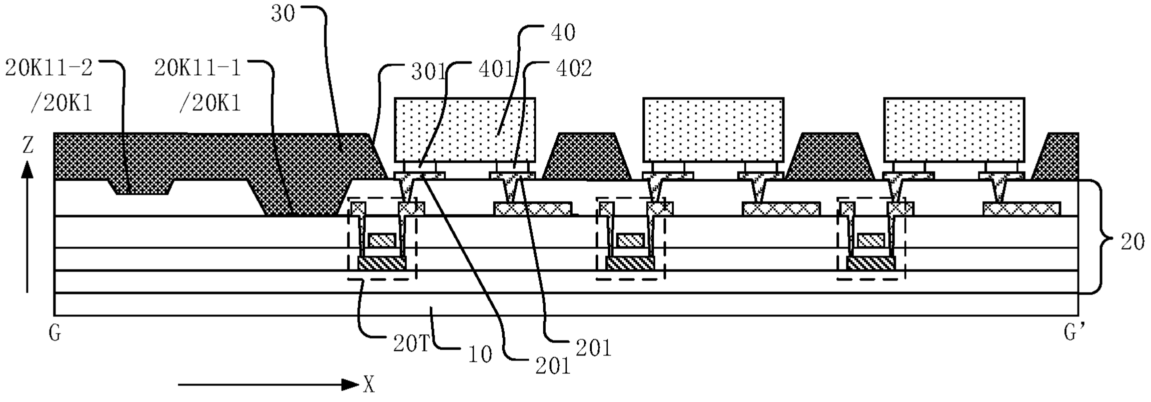
FIG. 17 is a cross-sectional view taken along a direction G-G' of FIG. 16.
Figure 18:
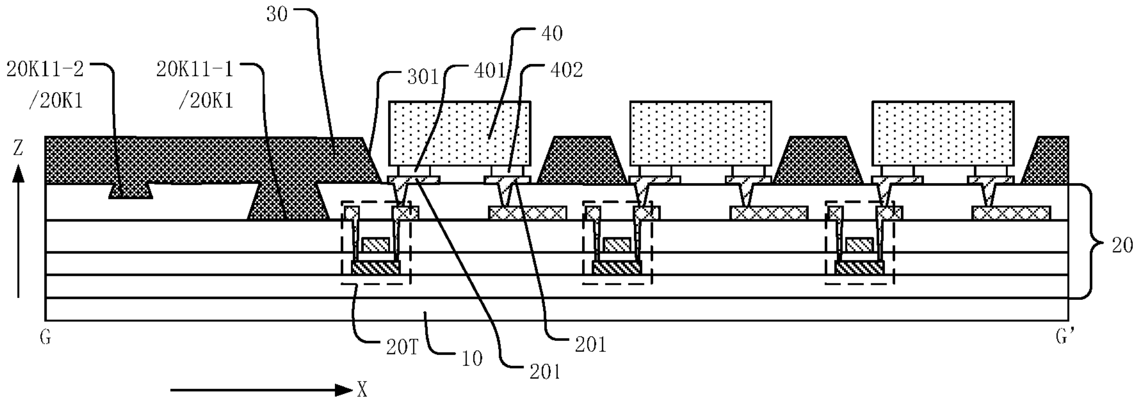
FIG. 18 is another cross-sectional view taken along a direction G-G' of FIG. 16.

In an embodiment, as shown in FIGS. 1, 16, 17 and 18, FIG. 17 is a cross-sectional view taken along a direction G-G' of FIG. 16, and FIG. 18 is another cross-sectional view taken along a direction G-G' of FIG. 16. In this embodiment, a cross-sectional shape of the third sub-groove 20K11-1 and a cross-sectional shape of the fourth sub-groove 20K11-2 may be inverted trapezoid (i.e., a structure in which the top opening of the groove is wide and the bottom surface of the groove is narrow) as shown in FIG. 17, or a cross-sectional shape of the third sub-groove 20K11-1 and a cross-sectional shape of the fourth sub-groove 20K11-2 may be trapezoid (i.e., a structure in which the top opening of the groove is narrow and the bottom surface of the groove is wide) as shown in FIG. 18, or a cross-sectional shape of one of the third sub-groove 20K11-1 and the fourth sub-groove 20K11-2 may be trapezoid (i.e., a structure in which the top opening of the groove is narrow and the bottom surface is wide), a cross-sectional shape of the other of the third sub-groove 20K11-1 and the fourth sub-groove 20K11-2 may be inverted trapezoid (i.e., a structure in which the top opening of the groove is wide and the bottom surface is narrow), and details are not described here in this embodiment.

In an embodiment, as shown in FIGS. 17 and 18, at least two sub-grooves forming the first groove 20K1 are such as the third sub-groove 20K11-1 and the fourth sub-groove 20K11-2, the width of the third sub-groove 20K11-1 and the width of the fourth sub-groove 20K11-2 may be different in the direction in which the light-emitting component 40 is directed towards the first groove 20K1, for example, the width of the third sub-groove 20K11-1 facing to the light-emitting component 40 may be wider, and the width of the fourth sub-groove 20K11-2 facing away from the light-emitting component 40 may be narrower, and/or in the direction perpendicular to the plane where the substrate 10 is located, a depth of the third sub-groove 20K11-1 and a depth of the fourth sub-groove 20K11-2 may be different. For example, the depth of the third sub-groove 20K11-1 facing to the light-emitting component 40 may be deeper, and a depth of the fourth sub-groove 20K11-2 facing away from the light-emitting component 40 may be shallower, so that the light-shielding performance near the light-emitting component 40 may be further enhanced. For details, reference may be made to the description of the differential design of the depth and/or the width of the first groove 20K1 in the above-described embodiments, and details are not described here in this embodiment.

Figure 19:
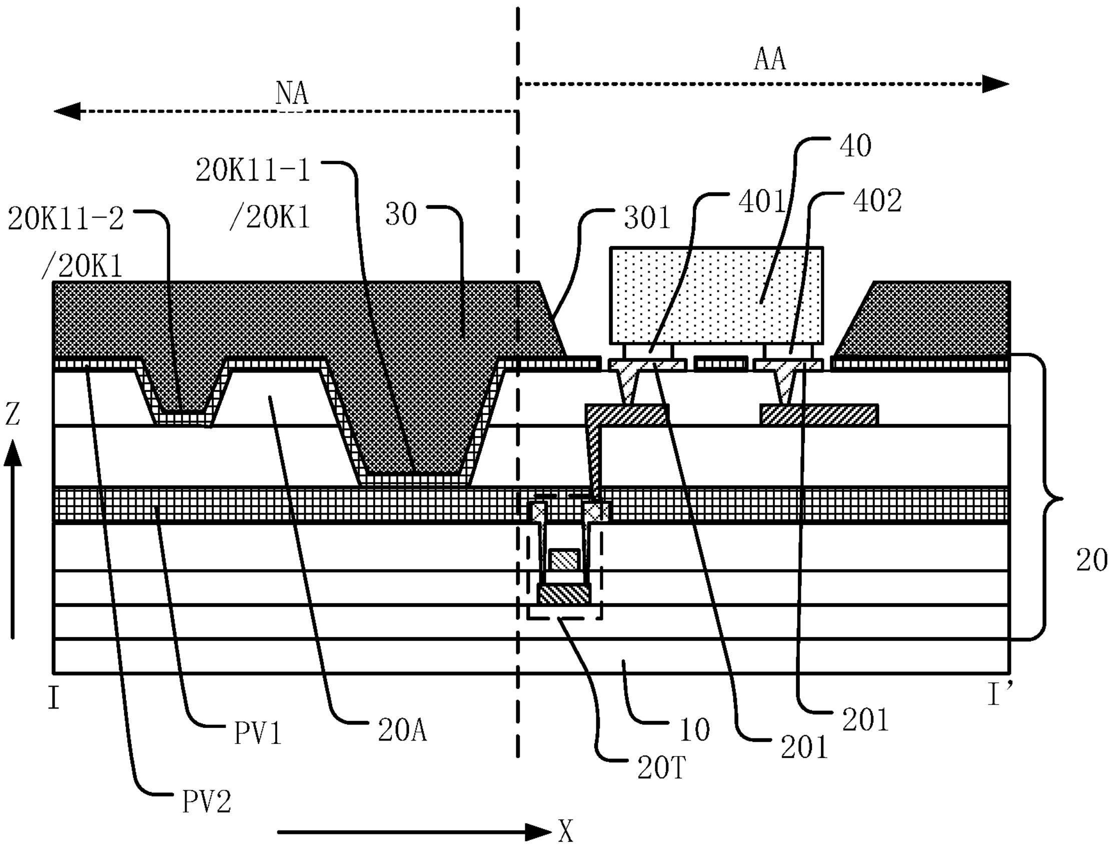
FIG. 19 is a cross-sectional view taken along a direction I-I' of FIG. 1.

In other some optional embodiments, as shown in FIGS. 1 and 19, FIG. 19 is a cross-sectional view taken along a direction I-I' of FIG. 1. The display panel 000 may include a display region AA and a non-display region NA disposed at least partially around the display region AA. The first groove 20K1 in this embodiment may also be provided in the drive array layer 20 of the non-display region NA. A structure of the first groove 20K1 may be referred to the above-described embodiments. For example, the first groove 20K1 may include multiple sub-grooves (the third sub-groove 20K11-1 and the fourth sub-groove 20K11-2) disposed around the display region AA. The depth and/or the width of the multiple sub-grooves may be designed differently, details are not described here in this embodiment, and specifically may be understood with reference to the above-described embodiments. The structure of the first groove 20K1 located in the non-display region may prevent the water vapor from invading, and may also increase the depth and area of riveting of the light-shielding layer 30 and the film layer below the light-shielding layer 30, so as to prevent cracks from entering the display region during the cutting of the panel, and further advantageously ensure the display quality of the display panel 000.

In an embodiment, when the film structure of the display panel 000 of this embodiment is fabricated, the drive array layer 20 includes at least a first inorganic layer PV1. The first inorganic layer PV1 may cover the thin film transistor 20T. Before the light-shielding layer 30 is fabricated, a second inorganic layer PV2 may be formed between the light-shielding layer 30 and the planarization layer (the first insulating layer 20A illustrated in FIG. 19). The second inorganic layer PV2 forms multiple hollow structures by an etching patterning process to expose the binding electrode 201 for binding the light-emitting component 40. In this embodiment, the second inorganic layer PV2 may be further provided to be in direct contact with the first inorganic layer PV1 below the first groove 20K1 through the first groove 20K1 located in the non-display region NA, that is, a depth of at least one sub-groove (third sub-groove 20K11-1 as shown in FIG. 19) in the first groove 20K may be just such that part of the second inorganic layer PV2 located within that sub-groove is in direct contact with the first inorganic layer PV1 below the second inorganic layer PV2, and further, the water oxygen resistance at the bezel of the display panel 000 may be improved by two inorganic layers that are in direct contact at a partial region of the non-display region NA.

It should be understood that when cross-sectional shapes of the third sub-groove 20K11-1 and the fourth sub-groove 20K11-2 included in the first groove 20K1 are both trapezoid-shaped (i.e., a structure in which the top opening of the groove is narrow and the bottom surface of the groove is wide) as shown in FIG. 18, during a fabrication process of the second inorganic layer PV2, a continuous second inorganic layer PV2 may be formed by a chemical vapor deposition (CVD) process and an atomic layer deposition (ALD) process in cooperation, and finally a stencil structure is etched at the binding electrode of the desired binding light-emitting component 40 by an etching process to expose the binding electrode 201 for binding the light-emitting component 40. In a specific implementation, reference may be made to fabrication processes known in the related art, and details are not described here in this embodiment.

It should be understood that when the first groove 20K1 in this embodiment includes multiple sub-grooves of different depths, such as, two third sub-grooves 20K11-1 having a relatively deep depth and one fourth sub-groove 20K11-2 having a relatively shallow depth, during the fabrication process, it is possible to firstly form one fourth sub-groove 20K11-2 having a relatively shallow depth and two spare sub-grooves 20K11-2 having a depth consistent with a depth of the fourth sub-grooves 20K11-2 by one etching, and then perform a second etching at the two spare sub-grooves to form two third sub-grooves 20K11-1 having a relatively deep depth. Alternatively, the third sub-groove 20K11-1 and the fourth sub-groove 20K11-2 having different depths may be formed by a halftone mask process, and this embodiment is not limited herein.

Figure 20:
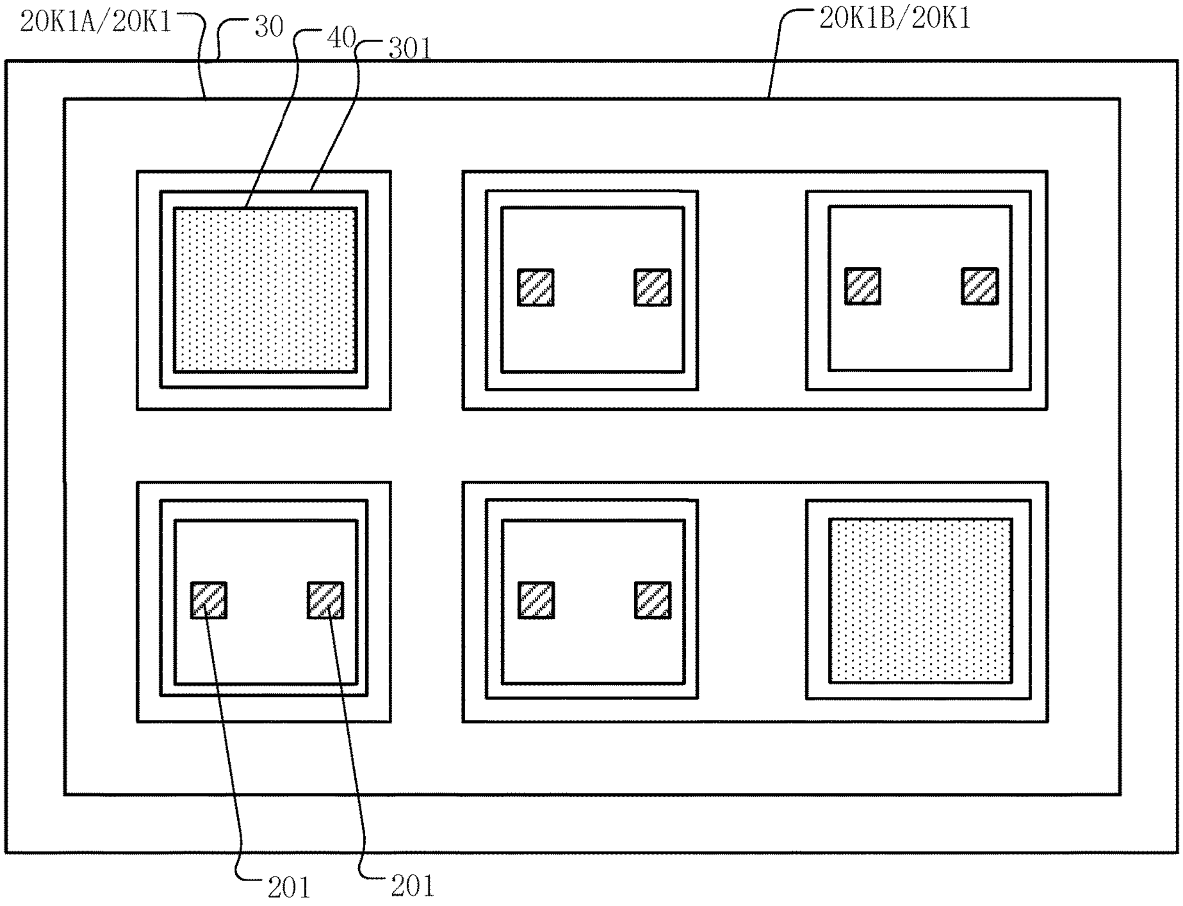
FIG. 20 is another partial plan view of a first groove of a part of regions where a light-emitting component is located in FIG. 1.

In some optional embodiments, reference is made to FIGS. 1 and 20, FIG. 20 is another partial plan view of a first groove of a part of regions where a light-emitting component is located in FIG. 1 (it should be understood that the transparent filling is performed in FIG. 20 in order to clearly illustrate the structure of this embodiment). In this embodiment, the multiple first grooves 20K1 include at least a first sub-groove 20K1A and a second sub-groove 20K1B. An orthographic projection of the first sub-groove 20K1A on the substrate 10 surrounds an orthographic projection of one light-emitting component of the multiple light-emitting components 40 on the substrate 10. An orthographic projection of the second sub-groove 20K1B on the substrate 10 surrounds orthographic projections of two light-emitting components of the multiple light-emitting components 40 on the substrate 10. The orthographic projection of the first sub-groove 20K1A on the substrate 10 at least partially overlaps with the orthographic projection of the second sub-groove 20K1B on the substrate 10.

This embodiment illustrates that the first groove 20K1 provided in the drive array layer 20 and at least partially surrounding the first opening 301 may be the annular structure, that is, a shape of the orthographic projection of the first groove 20K1 on the substrate 10 is annular. An orthographic projection of an annular first groove of the multiple annular first grooves 20K1 on the substrate 10 may surround orthographic projections of different numbers of light-emitting components 40 on the substrate 10, specifically, the multiple first grooves 20K1 includes at least the first sub-groove 20K1A and the second sub-groove 20K1B, the orthographic projection of the first sub-groove 20K1A on the substrate 10 surrounds the orthographic projection of one light-emitting component of the multiple light-emitting components 40 on the substrate 10. The orthographic projection of the second sub-groove 20K1B on the substrate 10 surrounds the orthographic projections of two light-emitting components of the multiple light-emitting components 40 on the substrate 10. The orthographic projection of the first sub-groove 20K1A on the substrate 10 at least partially overlaps with the orthographic projection of the second sub-groove 20K1B on the substrate 10, that is, the first sub-groove 20K1A and the second sub-groove 20K1B may share an edge. The multiple light-emitting components 40 included in the display panel 000 may include three light-emitting components 40 of different colors, and every three light-emitting components 40 of different colors may form a group, and an orthographic projection of one annular first sub-groove 20K1 on the substrate 10 may be disposed around the light-emitting components 40 of one color in the group, an orthographic projection of one annular second sub-groove 20K1B on the substrate 10 may be disposed around the light-emitting components 40 of the other two colors in the group, so that different transfer manners may be accommodated during the transfer fabrication process of the light-emitting component 40, the interference problem in the transfer process is improved, the transfer efficiency and the binding yield are ensured, the difficulty in the fabrication process of providing the first groove 20K1 in the drive array layer 20 is reduced, and thus the fabrication process efficiency is improved.

Figure 21:
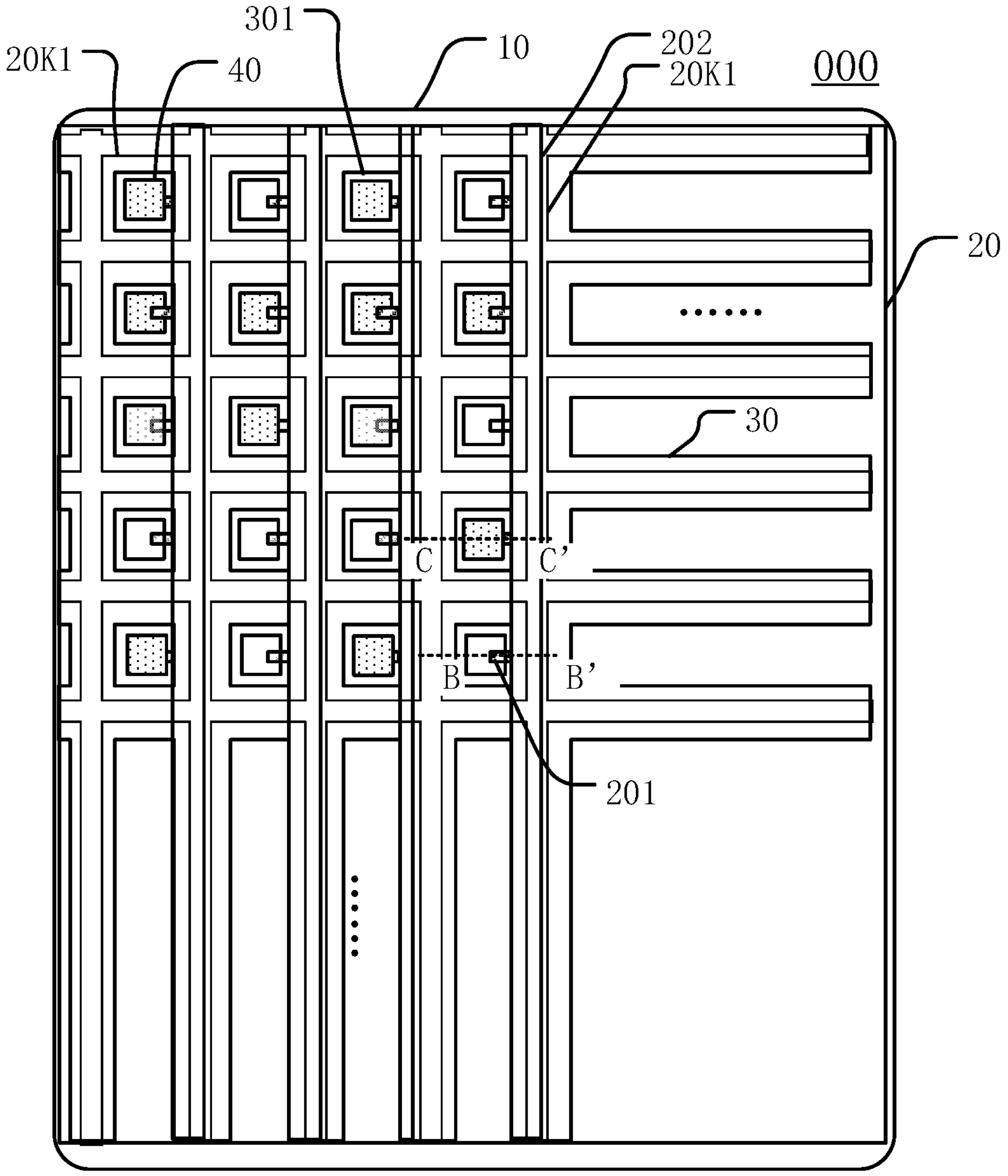
FIG. 21 is another plan view of a display panel according to an embodiment of the present disclosure.
Figure 22:
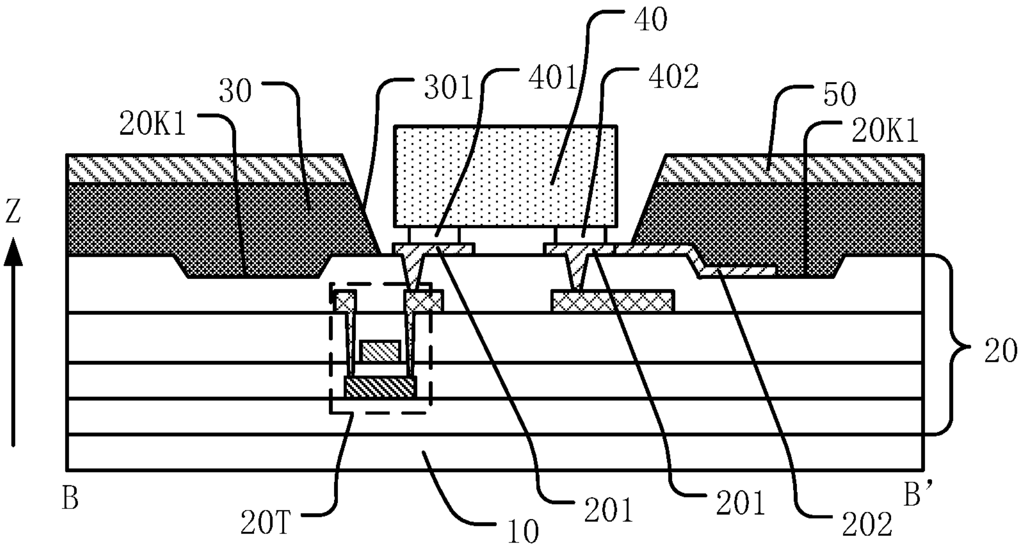
FIG. 22 is a cross-sectional view taken along a direction B-B' of FIG. 21.

In some optional embodiments, reference is made to FIGS. 21 and 22. FIG. 21 is another plan view of a display panel according to an embodiment of the present disclosure, and FIG. 22 is a cross-sectional view taken along a direction B-B' of FIG. 21 (it should be understood that the transparent filling is performed in FIG. 21 in order to clearly illustrate the structure of this embodiment, the cross-sectional views in the subsequent embodiments are simplified in order to clearly illustrate a diagram of the structure of the film layer of the panel in the subsequent embodiments, for example, the structure of the film layer such as the inorganic layer in FIG. 19 is not shown.) In this embodiment, the drive array layer 20 includes multiple first signal lines 202, at least a partial segment of a first signal line of the multiple first signal lines 202 overlaps with a respective first groove of the multiple first grooves 20K1 in a direction Z perpendicular to a plane where the substrate 10 is located.

This embodiment illustrates that it is generally necessary to provide multiple signal lines in the display panel 000, and the signal lines are used for transmitting, for the display panel 000, signal values for driving the light-emitting and display thereof. The drive array layer 20 may include multiple conductive metal layers, and the signal lines may be fabricated using one or more conductive film layers of the drive array layer 20. The drive array layer 20 in this embodiment may include multiple first signal lines 202, the first signal line 202 may be a scan line connected to a gate of the thin film transistor 20T, or an anode signal line connected to one of a source or a drain of the thin film transistor 20T, or the first signal line 202 may be a cathode signal line, and at this time, the first signal line 202 may be fabricated at the same layer as the binding electrode 202 and may be electrically connected to the cathode 402 of the light-emitting component 40 through the binding electrode 201 for supplying a cathode drive signal to the cathode 402 of the light-emitting component 40. In other some optional embodiments, the cathode signal line may be formed at a different layer from the binding electrode 202, and this embodiment is not particularly limited. An example in which the first signal line 202 is a cathode signal line is used for exemplary description in FIGS. 21 and 22 in this embodiment. The cathodes of a same row or column of light-emitting components 40 of the multiple light-emitting components 40 arranged in an array may be connected to a same first signal line 202, which advantageously reduces a number of the first signal lines 202 in the display panel 000 and reduce the wiring difficulty of the panel. In this embodiment, at least a partial segment of a first signal line of the multiple first signal lines 202 overlaps with a respective first groove of the multiple first grooves 20K1 in the direction perpendicular to the plane where the substrate is located, that is, a certain film layer of the drive array layer 20 such as the first groove 20K1 provided in the planarization layer as exemplified in the above-described embodiments may not avoid the first signal line 202, after the drive array layer 20 provides the first groove 20K1, at least a partial segment of the first signal line 202 may be routed within the first groove 20K1, so that in the direction Z perpendicular to the plane where the substrate 10 is located, at least a partial segment of the first signal line 202 overlaps the first groove 20K1, in a case of not changing an original length of the first signal line 202, the space occupied by the first signal line 202 and the first groove 20K1 between adjacent light-emitting components 40 may be shortened, and it is advantageous to reduce the interval between adjacent light-emitting components 40, further the overall Pixels Per Inch (PPI, which represents a number of light-emitting components 40 possessed per inch) of the display panel 000 may be improved, and thus the display quality is improved.

Figure 23:
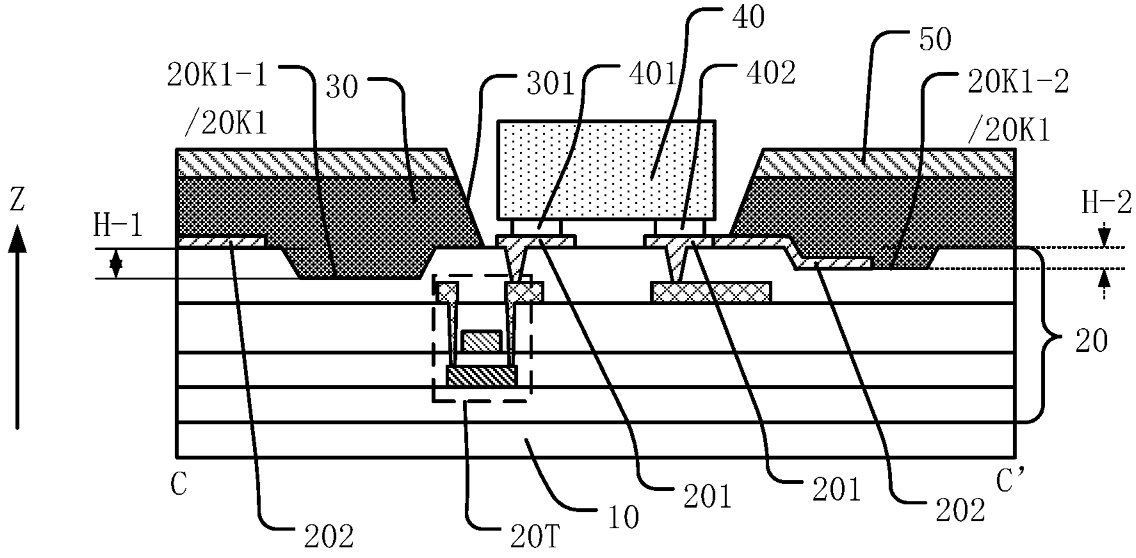
FIG. 23 is a cross-sectional view taken along a direction C-C' of FIG. 21.

In some optional embodiments, reference is made to FIGS. 21 and 23. FIG. 23 is a cross-sectional view taken along a direction C-C' of FIG. 21. In this embodiment, the first groove 20K1 includes a first region 20K1-1 and a second region 20K1-2. In the direction perpendicular to the plane where the substrate is located, a depth H-1 of the first groove 20K1 in the first region 20K1-1 is greater than a depth H-2 of the first groove 20K1 in the second region 20K1-2, and the first signal line 202 does not overlap with the first groove 20K1 in the first region 20K1-1.

This embodiment illustrates that the first grooves 20K1 provided at least partially around the first opening 301 may be differentially designed at different positions, the first grooves 20K1 may include the first region 20K1-1 and the second region 20K1-2 located at different positions, and the first region 20K1-1 and the second region 20K1-2 may be at different positions around the same light-emitting component 40, and the first region 20K1-1 and the second region 20K1-2 may also be at different positions around different light-emitting components 40, which is not limited in this embodiment. In the direction Z perpendicular to the plane where the substrate 10 is located, the depth H-1 of the first groove 20K1 in the first region 20K1-1 is greater than the depth H-2 of the first groove 20K1 in the second region 20K1-2. As shown in the above-described embodiments, the position closer to the thin film transistor 20T or to the light-emitting component 40 may be understood as the first region 20K1-1 of the first groove 20K1, which is disposed in the direction Z perpendicular to the plane where the substrate 10 is located, and the depth H-1 of the first groove 20K1 in the first region 20K1-1 is greater than the depth H-2 of the first groove 20K1 in the second region 20K1-2, so that the filling space of the light-shielding layer 30 at the deeper position may be enhanced and the light-shielding effect may be improved, and reference may be made in detail to the description of the above-described embodiments. This embodiment further provides that the first signal line 202 does not overlap the first groove 20K1 in the first region 20K1-1, and that at least a partial segment of the first signal line 202 in the first region 20K1-1 partially overlaps with the first groove 20K1 of the region only in the second region 20K1-2 of the shallow depth position, the wiring of the first signal line 202 may be made to avoid the deeper first region 20K1-1, in turn, it may be avoided that the first signal line 202 causes a risk of breaking when the first signal line 202 runs ramping in the first groove 20K1 in the first region 20K1-1, and thus the first signal line 202 provided in this embodiment does not overlap with the first groove 20K1 in the first region 20K1-1, and it is advantageous to ensure the stability of the signal transmission on the first signal line 202.

In some optional embodiments, with continued reference to FIGS. 1 and 4, in this embodiment, the drive array layer 20 includes at least a first insulating layer 20A. The first groove 20K1 is located in the first insulating layer 20A. The drive array layer 20 may further include at least an active layer LP, a first metal layer M1, a second metal layer M2, a transparent conductive layer LT, and the like. The active layer LP may be used for fabricating an active portion of the thin film transistor 20T, the first metal layer M1 may be used for fabricating the gate of the thin film transistor 20T, the second metal layer M2 may be used for fabricating a source/drain and a signal line, and the like of the thin film transistor 20T, and the transparent conductive layer LT may be used for fabricating a binding electrode 201 and a signal line, and the insulating layer between the conductive layers may be understood as a first insulating layer 20A, such as a planarization layer between the second metal layer M2 and the transparent conductive layer LT, an interlayer insulating layer between the first metal layer M1 and the second metal layer M2, a gate insulating layer between the active layer LP and the first metal layer M1, and the like, and may be understood as the first insulating layer 20A. An example in which a planarization layer between the second metal layer M2 and the transparent conductive layer LT is used as the first insulating layer 20A in the drawings of this embodiment is used for exemplary description.

In this embodiment, the first groove 20K1 is located at the first insulating layer 20A, and the first groove 20K1 is fabricated by a single layer of the first insulating layer 20A, so that the sinking of the light-shielding layer 30 and the protective layer 50 can be achieved by one first insulating layer 20A, the film layer involved in grooving is less, and the fabrication process may be simplified.

In an embodiment, as shown in FIGS. 1 and 4, no other insulating layer is included between the first insulating layer 20A and the light-shielding layer 30, that is, the first insulating layer 20A in which the first grooves 20K1 are provided may be understood as a planarization layer closest to the light-shielding layer 30, and the planarization layer is generally thick, thereby facilitating the reasonable design of the depth of the first grooves 20K1, and making the first grooves 20K1 in the planarization layer closest to the light-shielding layer 30, ensuring the flatness of the film layer where the lower thin film transistor 20T is located, and thus ensuring the performance of the thin film transistor 20T.

Figure 24:
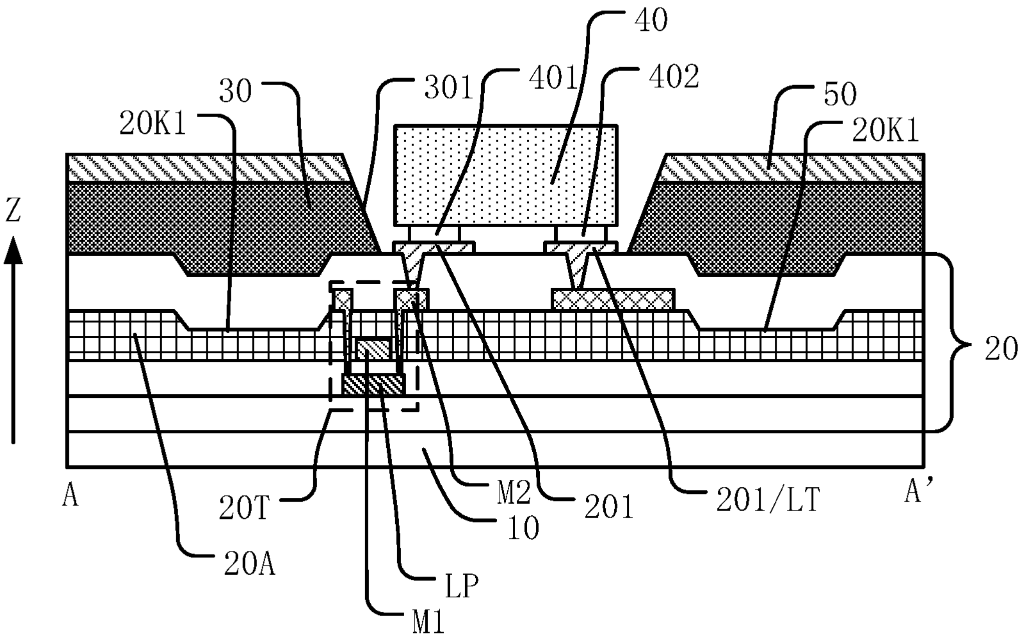
FIG. 24 is another cross-sectional view taken along a direction A-A' of FIG. 1.

In an embodiment, as shown in FIG. 1 and FIG. 24, FIG. 24 is another cross-sectional view taken along a direction A-A' of FIG. 1. In this embodiment, the first insulating layer 20A may also be understood as an interlayer insulating layer between the first metal layer M1 and the second metal layer M2. The first groove 20K1 is formed in the interlayer insulating layer between the first metal layer M1 and the second metal layer M2, and the subsequently fabricated conductive layer and insulating layer are stacked on the first insulating layer 20A. Finally, a lower limit space for accommodating the filling of the light-blocking layer 30 is formed at the first groove 20K1, so that the problem of bonding interference during the transfer due to the high height of the film layer around the light-emitting component 40 is solved, and the risk of interference between the microstamp and the film layer around the light-emitting component 40 in the depression process of transferring the light-emitting component 40 using the microstamp is reduced, thereby improving the transfer efficiency of the light-emitting component 40 and the subsequent binding yield with the binding electrode 201, and thus the display quality is ensured.

It should be understood that the first insulating layer 20A may also be understood as the insulating layer between other conductive layers in the drive array layer 20, and details are not described here in this embodiment.

Figure 25:
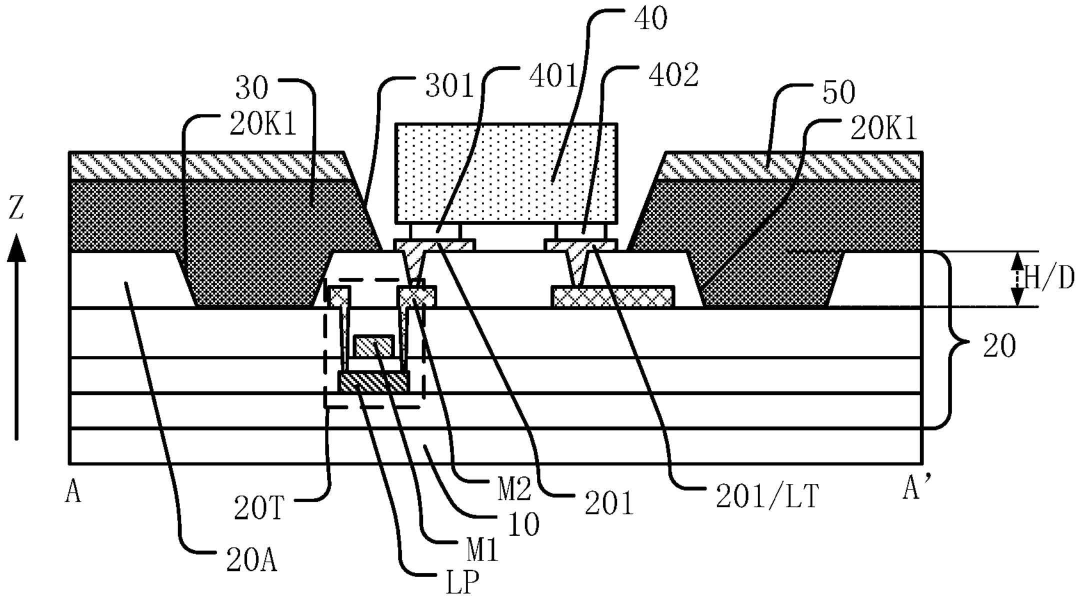
FIG. 25 is another cross-sectional view taken along a direction A-A' of FIG. 1.

In some optional embodiments, reference is made to FIGS. 1, 4 and 25, FIG. 25 is another cross-sectional view taken along a direction A-A' of FIG. 1. In this embodiment, the depth H of the first groove 20K1 is less than or equal to the thickness D of the first insulating layer 20A in the direction Z perpendicular to the plane where the substrate 10 is located.

This embodiment illustrates that when the first groove 20K1 provided in the drive array layer 20 is made of a single insulating layer such as the first insulating layer 20A (an example in which the first insulating layer 20A provided with the first groove 20K1 is used as the planarization layer closest to the light-shielding layer 30 is used for exemplary description in the drawings of this embodiment), the depth H of the first groove 20K1 may be less than the thickness D of the first insulating layer 20A in the direction Z perpendicular to the plane where the substrate 10 is located, that is, as shown in FIG. 4, the first groove 20K1 does not penetrate through the thickness of the first insulating layer 20A, a halftone mask process may be used in the fabrication process of the first groove 20K1, and the first groove 20K1 and the via hole provided in the first insulating layer 20A are fabricated in the same fabrication process. It should be understood that the via hole provided in the first insulating layer 20A may be a via hole used when the binding electrode 201 is connected to the source or drain of the thin film transistor 20T. Alternatively, in the direction Z perpendicular to the plane where the substrate 10 is located, the depth H of the first groove 20K1 may be equal to the thickness D of the first insulating layer 20A, as shown in FIG. 25, that is, the first groove 20K1 penetrates through the thickness of the first insulating layer 20A, and the first groove 20K1 may be fabricated in the same process as the via hole provided in the first insulating layer 20A. It should be understood that the via hole provided in the first insulating layer 20A may be a via hole used when the binding electrode 201 is connected to the source or the drain of the thin film transistor 20T, thereby saving the fabrication process cost and improving the fabrication process efficiency.

Figure 26:
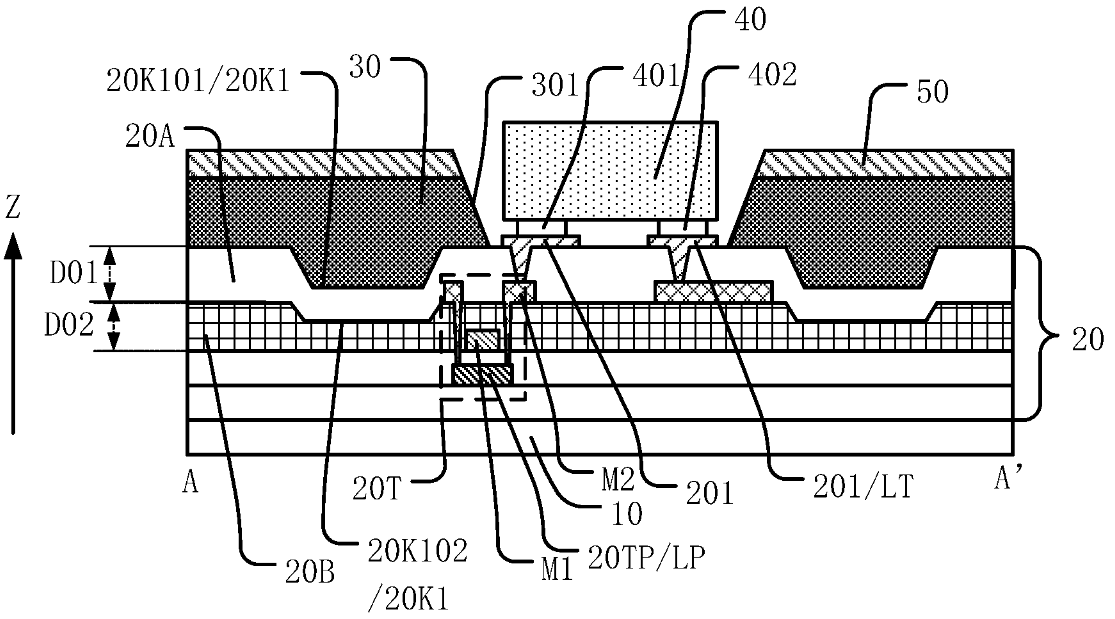
FIG. 26 is another cross-sectional view taken along a direction A-A' of FIG. 1.

In some optional embodiments, reference is made to FIGS. 1 and 26, FIG. 26 is another cross-sectional view taken along a direction A-A' of FIG. 1. In this embodiment, the drive array layer 20 includes at least a first insulating layer 20A and a second insulating layer 20B. The second insulating layer 20B is located on a side of the first insulating layer 20A facing the substrate 10. The first groove 20K1 includes a first hollow portion 20K101 located in the first insulating layer 20A and a second hollow portion 20K102 located in the second insulating layer 20B. The first hollow portion 20K101 and the second hollow portion 20K102 overlap with each other in a direction Z perpendicular to the plane where the substrate 10 is located.

This embodiment illustrates that the first groove 20K1 provided in the drive array layer 20 may be made of at least two insulating layers such as the first insulating layer 20A and the second insulating layer 20B. In the drawings of this embodiment, an example in which the first insulating layer 20A provided with the first groove 20K1 is a planarization layer closest to the light-shielding layer 30, and the second insulating layer 20B is an interlayer insulating layer between the second metal layer M2 and the first metal layer M1 is used for exemplary description. The second insulating layer 20B is located on a side of the first insulating layer 20A facing the substrate 10. The first groove 20K1 provided around the first opening 301 includes the first hollow portion 20K101 located in the first insulating layer 20A and the second hollow portion 20K102 located in the second insulating layer 20B. In the direction Z perpendicular to the plane where the substrate 10 is located, the first hollow portion 20K101 and the second hollow portion 20K102 overlap with each other to form a sinking space, and the sinking space is used for accommodating the filling space of the light-shielding layer 30. In this embodiment, at least two insulating layers cooperate to form the first groove 20K1 in a superimposed manner, the depth of the first grooves 20K1 is more controllable. For example, the first groove 20K1 is provided by the at least two insulating layers at a position where a strong light-shielding effect is required, so that the depth of the first grooves 20K1 may be increased, the fillable space of the light-shielding layer 30 may be enlarged, and the light-shielding performance of the light-shielding layer 30 filled in the first groove 20K1 may be improved while further reducing the distance between a surface of a side of the light-shielding layer 30 facing away from the substrate 10 and the substrate 10.

In this embodiment, in the direction Z perpendicular to the plane where the substrate 10 is located, the depth of the first hollow portion 20K101 is less than or equal to the thickness D01 of the first insulating layer 20A, and the depth of the second hollow portion 20K102 is less than or equal to the thickness D02 of the second insulating layer 20B.

As shown in FIGS. 1 and 26, in the direction Z perpendicular to the plane where the substrate 10 is located, the depth of the first hollow portion 20K101 is less than the thickness D01 of the first insulating layer 20A, and the depth of the second hollow portion 20K102 is less than the thickness D02 of the second insulating layer 20B. The first groove 20K1 provided in the drive array layer 20 may be made of at least two insulating layers such as the first insulating layer 20A and the second insulating layer 20B. The first groove 20K1 provided around the first opening 301 includes the first hollow portion 20K101 located in the first insulating layer 20A and the second hollow portion 20K102 located in the second insulating layer 20B. In the direction Z perpendicular to the plane where the substrate 10 is located, the first hollow portion 20K101 does not penetrate through the thickness of the first insulating layer 20A, the second hollow portion 20K102 does not penetrate through the thickness of the second insulating layer 20B, the first hollow portion 20K101 and the second hollow portion 20K102 overlap with each other to form a sinking space, and the sinking space is used for accommodating the filling space of the light-shielding layer 30. In this embodiment, at least two insulating layers cooperate to form the first groove 20K1 in a superimposed manner, the depth of the first grooves 20K1 is more controllable.

Figure 27:
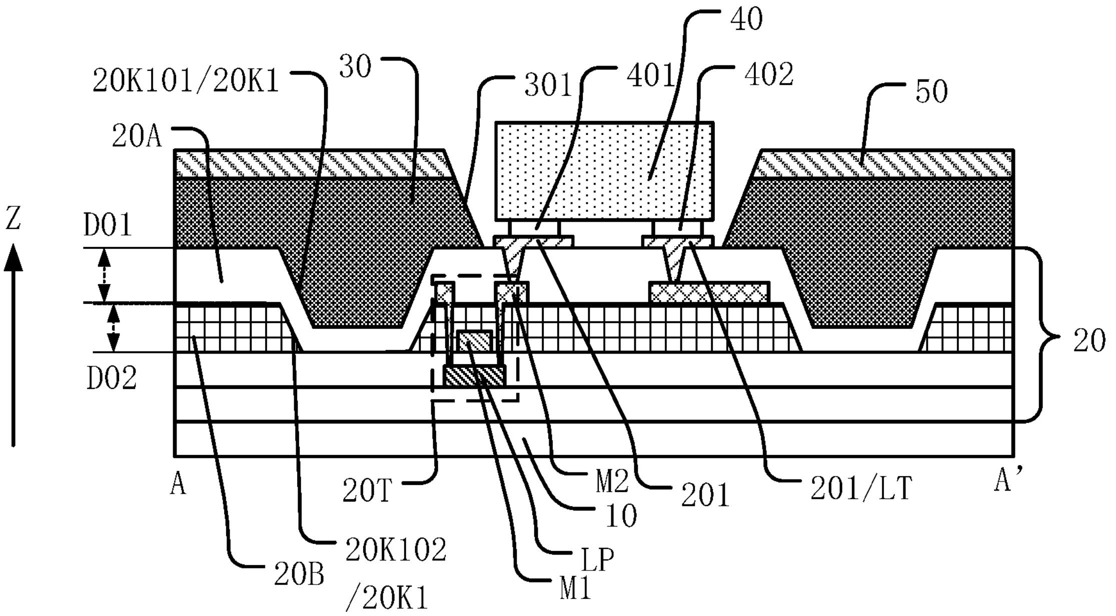
FIG. 27 is another cross-sectional view taken along a direction A-A' of FIG. 1.

Or, as shown in FIG. 1 and FIG. 27, FIG. 27 is another cross-sectional view taken along a direction A-A' of FIG. 1. In the direction Z perpendicular to the plane where the substrate 10 is located, the depth of the first hollow portion 20K101 is less than the thickness D01 of the first insulating layer 20A, and the depth of the second hollow portion 20K102 is equal to the thickness D02 of the second insulating layer 20B. The first groove 20K1 provided in the drive array layer 20 may be made of at least two insulating layers such as the first insulating layer 20A and the second insulating layer 20B. The first groove 20K1 provided around the first opening 301 includes the first hollow portion 20K101 located in the first insulating layer 20A and the second hollow portion 20K102 located in the second insulating layer 20B. In the direction Z perpendicular to the plane where the substrate 10 is located, the first hollow portion 20K101 does not penetrate through the thickness of the first insulating layer 20A, the second hollow portion 20K102 penetrates through the thickness of the second insulating layer 20B, the first hollow portion 20K101 and the second hollow portion 20K102 overlap with each other to form a sinking space, and the sinking space is used for accommodating the filling space of the light-shielding layer 30. In this embodiment, at least two insulating layers cooperate to form the first groove 20K1 in a superimposed manner, the depth of the first grooves 20K1 is more controllable.

Figure 28:
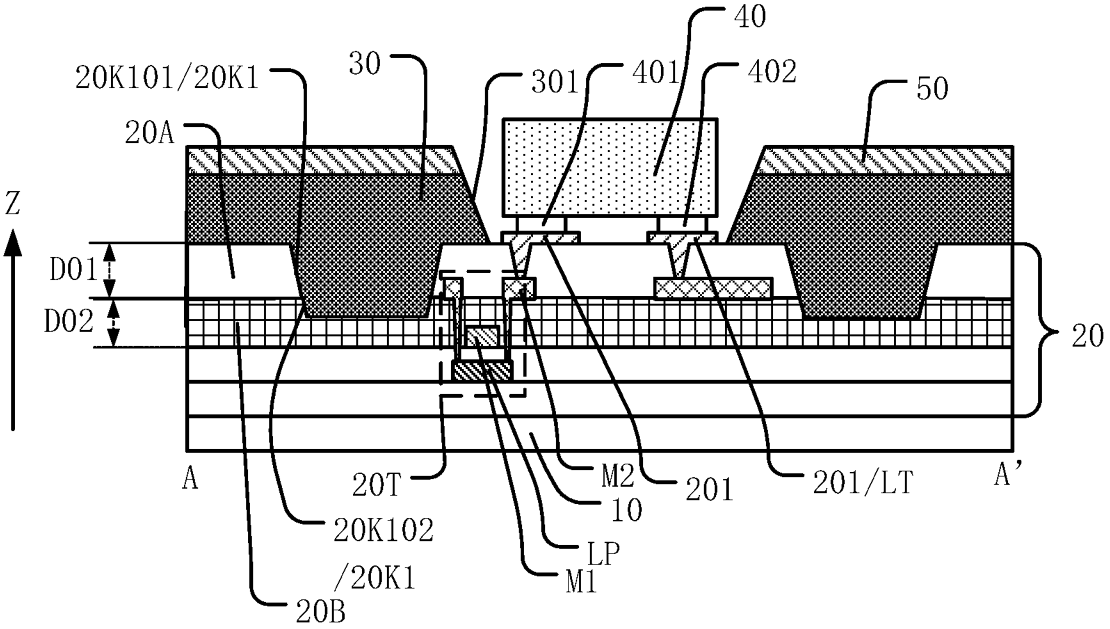
FIG. 28 is another cross-sectional view taken along a direction A-A' of FIG. 1.

Or, as shown in FIG. 1 and FIG. 28, FIG. 28 is another cross-sectional view taken along a direction A-A' of FIG. 1. In the direction Z perpendicular to the plane where the substrate 10 is located, the depth of the first hollow portion 20K101 is equal to the thickness D01 of the first insulating layer 20A, and the depth of the second hollow portion 20K102 is less than the thickness D02 of the second insulating layer 20B. The first groove 20K1 provided in the drive array layer 20 may be made of at least two insulating layers such as the first insulating layer 20A and the second insulating layer 20B. The first groove 20K1 provided around the first opening 301 includes the first hollow portion 20K101 located in the first insulating layer 20A and the second hollow portion 20K102 located in the second insulating layer 20B. In the direction Z perpendicular to the plane where the substrate 10 is located, the first hollow portion 20K101 penetrates through the thickness of the first insulating layer 20A, the second hollow portion 20K102 does not penetrate through the thickness of the second insulating layer 20B, the first hollow portion 20K101 and the second hollow portion 20K102 overlap with each other to form a sinking space, and the sinking space is used for accommodating the filling space of the light-shielding layer 30. In this embodiment, at least two insulating layers cooperate to form the first groove 20K1 in a superimposed manner, the depth of the first grooves 20K1 is more controllable.

Figure 29:
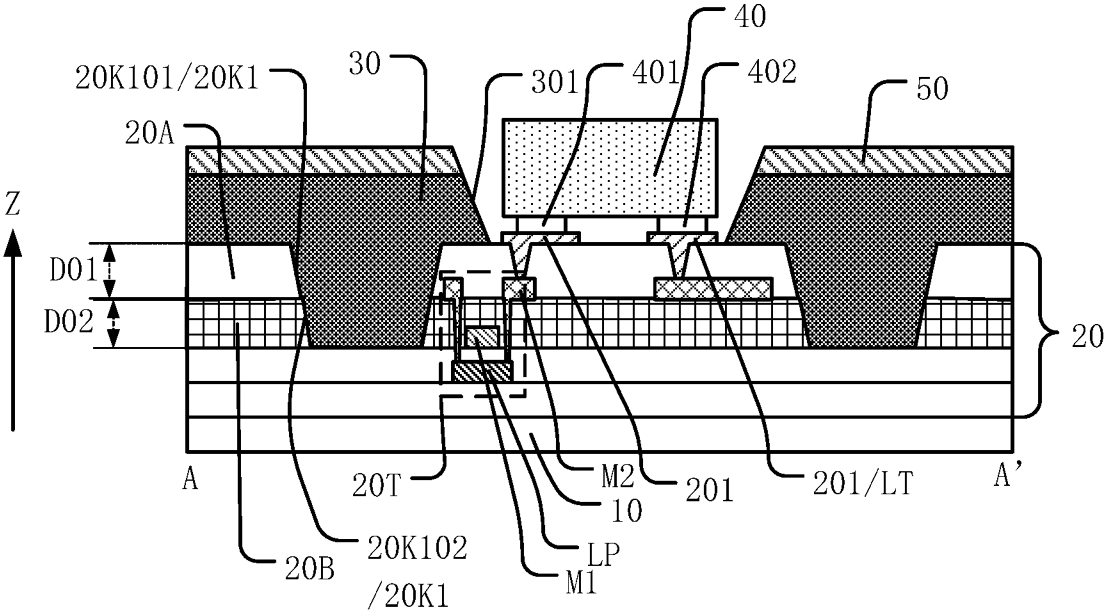
FIG. 29 is another cross-sectional view taken along a direction A-A' of FIG. 1.

Or, as shown in FIG. 1 and FIG. 29, FIG. 29 is another cross-sectional view taken along a direction A-A' of FIG. 1. In the direction Z perpendicular to the plane where the substrate 10 is located, the depth of the first hollow portion 20K101 is equal to the thickness D01 of the first insulating layer 20A, and the depth of the second hollow portion 20K102 is equal to the thickness D02 of the second insulating layer 20B. The first groove 20K1 provided in the drive array layer 20 may be made of at least two insulating layers such as the first insulating layer 20A and the second insulating layer 20B. The first groove 20K1 provided around the first opening 301 includes the first hollow portion 20K101 located in the first insulating layer 20A and the second hollow portion 20K102 located in the second insulating layer 20B. In the direction Z perpendicular to the plane where the substrate 10 is located, the first hollow portion 20K101 penetrates through the thickness of the first insulating layer 20A, the second hollow portion 20K102 also penetrates through the thickness of the second insulating layer 20B, the first hollow portion 20K101 and the second hollow portion 20K102 overlap with each other to form a sinking space, and the sinking space is used for accommodating the filling space of the light-shielding layer 30. In this embodiment, at least two insulating layers cooperate to form the first groove 20K1 in a superimposed manner, the depth of the first grooves 20K1 is more controllable.

Figure 30:
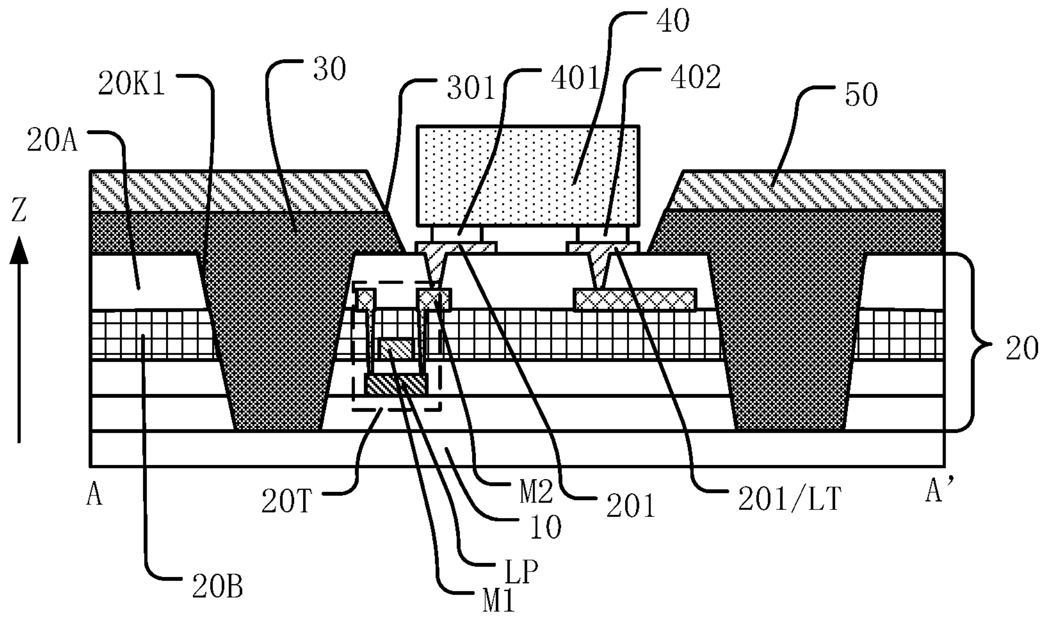
FIG. 30 is another cross-sectional view taken along a direction A-A' of FIG. 1.

In an embodiment, as shown in FIG. 1 and FIG. 30, FIG. 30 is another cross-sectional view taken along a direction A-A' of FIG. 1. The first grooves 20K1 provided in the drive array layer 20 may be made of multiple insulating layers. In the direction Z perpendicular to the plane where the substrate 10 is located, the first grooves 20K1 may penetrate through all the insulating layers on the substrate 10. Thus, when the light-shielding layer 30 is filled in the depressed first grooves 20K1, a structure surrounding the thin film transistor 20T in the drive array layer 20 may be formed, so as to better shield the light, thereby further reducing the influence of the light on the driving performance of the thin film transistor 20T and reducing the light leakage current.

In an embodiment, as shown in FIG. 1, FIGS. 25 to 30, and FIG. 31, FIG. 31 is another cross-sectional view taken along a direction A-A' of FIG. 1. In this embodiment, a side wall 20K1C of the first groove 20K1 includes either a beveled shape or a stepped shape.

Figure 31:
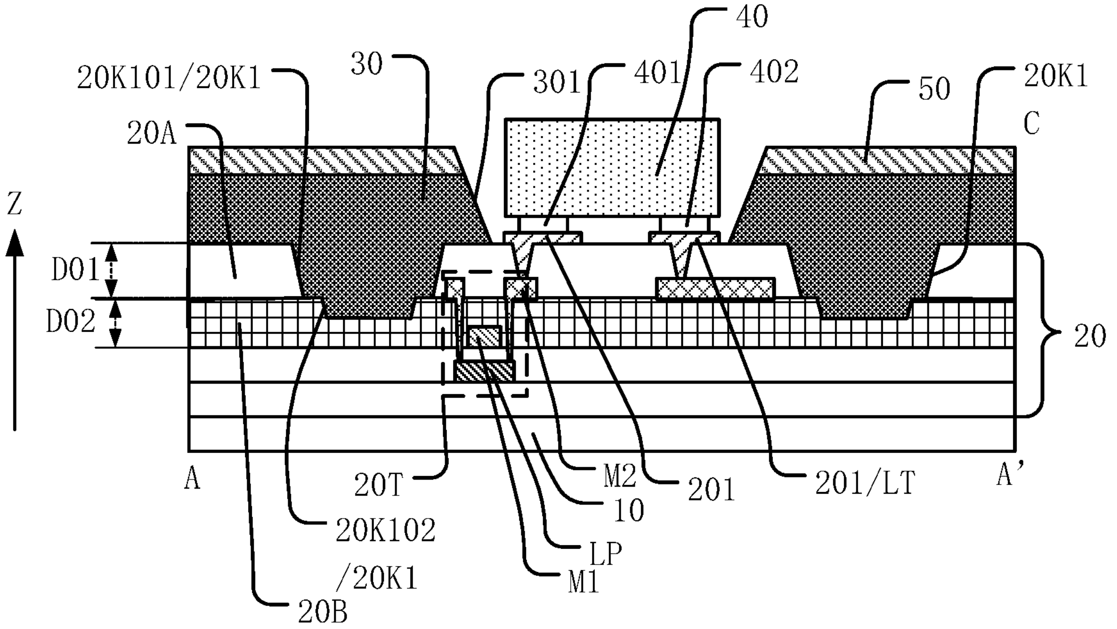
FIG. 31 is another cross-sectional view taken along a direction A-A' of FIG. 1.

This embodiment illustrates that the side wall 20K1C of the first groove 20K1 provided in the drive array layer 20 may be beveled (as shown in FIGS. 25 to 30), or the side wall 20K1C of the first groove 20K1 may be stepped. When the first grooves 20K1 are provided in at least two insulating layers, when the first groove 20K1 is formed using at least two insulating layers, the first hollow portion 20K101 and the second hollow portion 20K102 having different sizes are stacked to form the side wall 20K1C of the first groove 20K1 as a step shape (as shown in FIG. 31), so that sizes of the hollow portions of different insulating layers may be flexibly disposed to avoid some of the conductive portion structures in the drive array layer 20.

In some optional embodiments, with continued reference to FIGS. 1 and 26, the drive array layer 20 includes multiple thin film transistors 20T, a thin film transistor of the multiple thin film transistors 20T includes an active portion 20TP. The active portion 20TP may be fabricated using the active layer LP of the drive array layer 20. In the direction Z perpendicular to the plane where the substrate 10 is located, the first groove 20K1 is located on a side of the film layer on which the active portion 20TP is located facing away from the substrate 10.

This embodiment illustrates that the first groove 20K1 provided in the drive array layer 20 may be disposed to avoid an insulating layer below a film layer in which the active portion 20TP of the thin film transistor 20T is located, that is, in the direction Z perpendicular to the plane where the substrate 10 is located, the first groove 20K1 is located on a side where the film layer where the active portion 20TP is located facing away from the substrate 10, so that when the insulating layer below the active portion 20TP is provided with the first groove 20K1, it is avoided that the active portion 20TP is prone to sinking unevenness, which affects the characteristics of the thin film transistor 20T itself. Therefore, the first groove 20K1 is located on a side of a film layer where the active portion 20TP is located facing away from the substrate 10, which is advantageous for ensuring the drive performance of the thin film transistor 20T in the drive array layer 20 and ensuring the display uniformity of the display panel 000.

Figure 32:
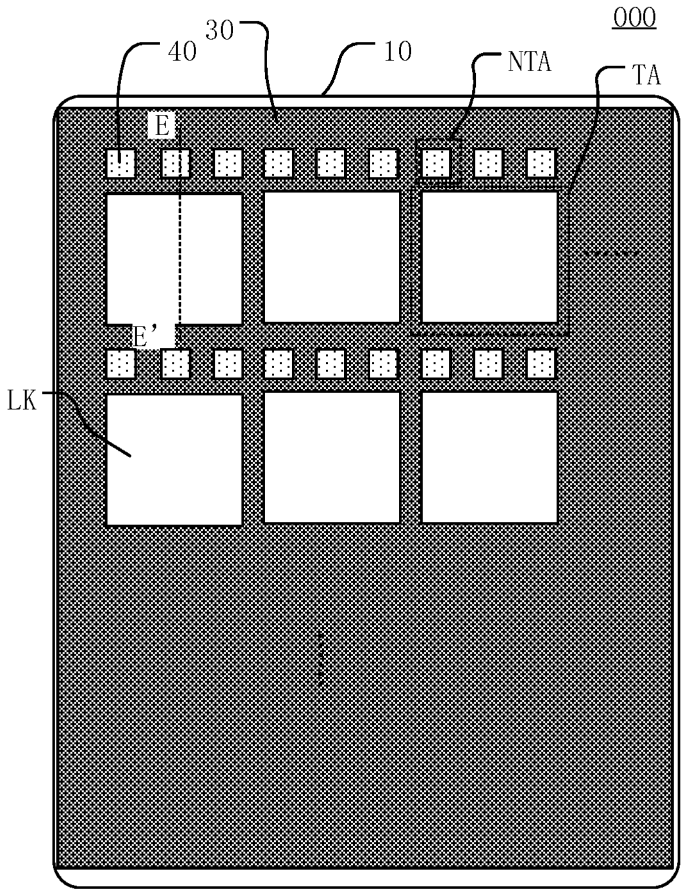
FIG. 32 is another plan view of a display panel according to an embodiment of the present disclosure.
Figure 33:
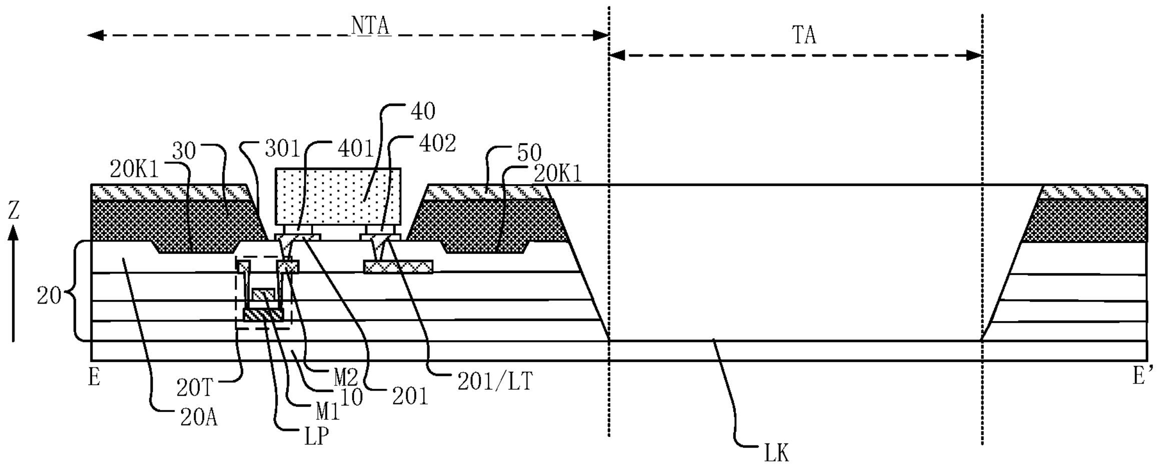
FIG. 33 is a cross-sectional view taken along a direction E-E' of FIG. 32.

In some optional embodiments, reference is made to FIGS. 32 and 33. FIG. 32 is another plan view of a display panel according to an embodiment of the present disclosure, and FIG. 33 is a cross-sectional view taken along a direction E-E' of FIG. 32 (it should be understood that the transparent filling is performed in FIG. 32 in order to clearly illustrate the structure of this embodiment). In this embodiment, the display panel 000 includes a transparent region TA and a non-transparent region NTA. The light-emitting component 40 is located in the non-transparent region NTA, a side of the substrate 10 in the transparent region TA includes a second opening LK, and the second opening LK penetrates through a film layer on the side of the substrate 10 in a direction facing to the substrate 10, and the second opening LK is filled with a transparent material.

The display panel 000 in this embodiment may be a transparent display panel, for example, the display panel 000 includes a transparent region TA and a non-transparent region NTA, the light-emitting component 40 is located in the non-transparent region NTA, a region other than the light-emitting component 40 may be formed into the transparent region TA by digging a hole, a side of a substrate 10 of the transparent region TA may be formed into the transparent region TA by providing a second opening LK, and the second opening LK penetrates through a film layer on a side of the substrate 10 in a direction facing to the substrate 10 to form the transparent region TA. The second opening LK is filled with the transparent material, so that the flatness of the film layer of the whole display panel can be ensured. This embodiment illustrates that the first grooves 20K1 provided in the light-shielding layer 30 and the drive array layer 20 may be both located in the non-transparent region NTA, so that the binding yield and the transfer efficiency of the light-emitting component 40 in the transparent display panel can be ensured, and the display quality of the transparent display panel can also be improved.

It should be understood that the arrangement of the transparent region TA and the non-transparent region NTA in the display panel 000 is merely illustrated in FIG. 32 of this embodiment. In a specific implementation, the arrangement of the transparent region TA and the non-transparent region NTA in the display panel 000 includes, but is not limited to, this arrangement, and the transparent region TA and the non-transparent region NTA are arranged at intervals in a transverse direction in the drawings, and the transparent region TA and the non-transparent region NTA are arranged at intervals in a longitudinal direction in the drawings, which is not limited in this embodiment. Specifically, reference may be made to the structure of the transparent display panel in the related art.

Figure 34:
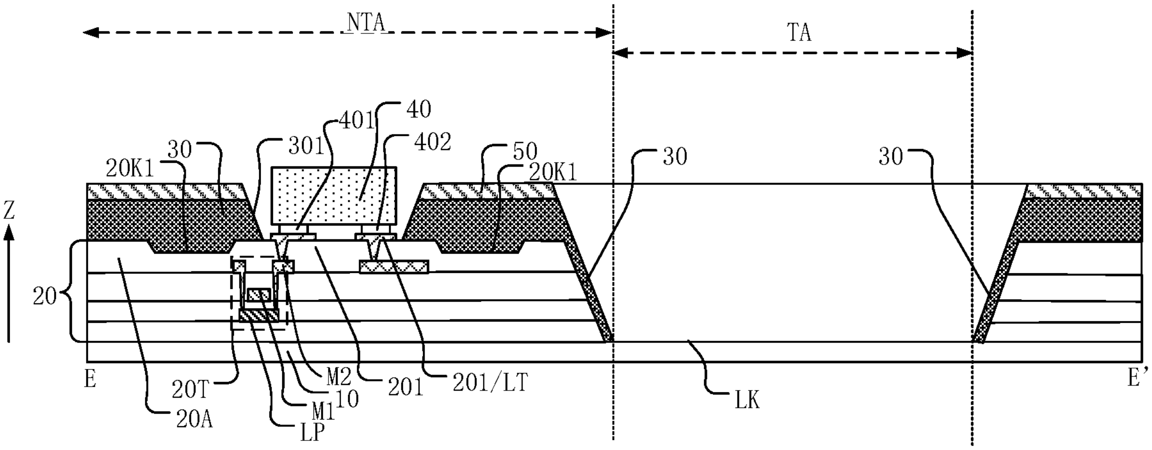
FIG. 34 is another cross-sectional view taken along a direction E-E' of FIG. 32.

In some optional embodiments, reference is made to FIGS. 32, 33, and 34, FIG. 34 is another cross-sectional view taken along a direction E-E' of FIG. 32. In this embodiment, the light-shielding layer 30 covers at least part of side walls of the second opening LK.

This embodiment illustrates that the display panel 000 is a transparent display panel. When the transparent region TA is provided with the second opening LK penetrating above the substrate 10, the light-shielding layer 30 covers at least part of side wall of the second opening LK (as shown in FIG.

33). Further, the light-shielding layer 30 can cover the whole side wall of the second opening LK (as shown in FIG. 34), so that the light may be shielded by the light-shielding layer 30 to reduce the screen reflectivity, and the thin film transistor 20T of the non-transparent region NTA can be covered as much as possible, thereby improving the problem of leakage current after the light is irradiated to the thin film transistor 20T, and further improving the display quality.

Figure 35:
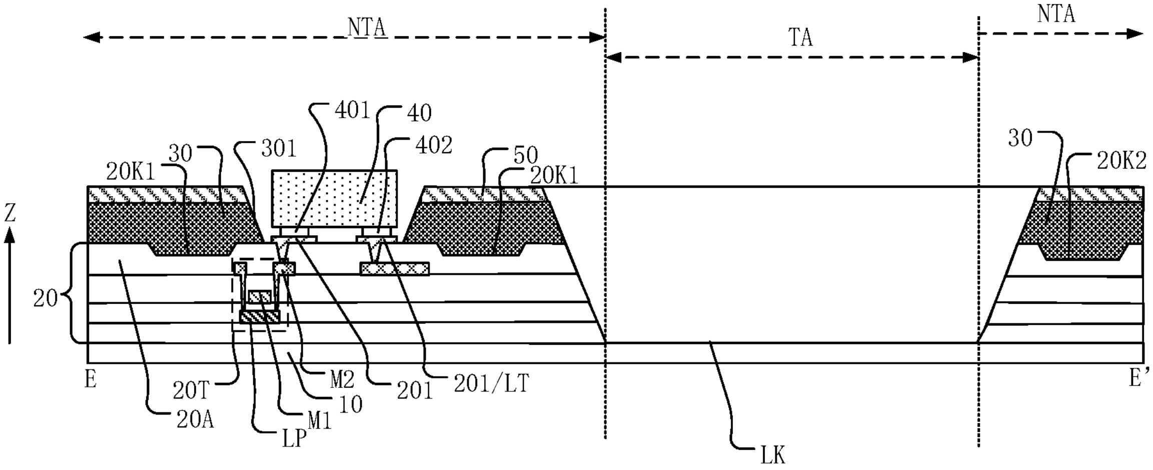
FIG. 35 is another cross-sectional view taken along a direction E-E' of FIG. 32.

In some optional embodiments, reference is made to FIGS. 32 and 35, FIG. 35 is another cross-sectional view taken along a direction E-E' of FIG. 32. In this embodiment, the drive array layer 20 further includes a second groove 20K2, an orthographic projection of the second groove 20K2 on the substrate 10 at least partially surrounds an orthographic projection of the second opening LK on the substrate 10, and at least part of the light-shielding layer 30 is located within the second grooves 20K2.

This embodiment illustrates that the drive array layer 20 further includes the second groove 20K2, the second groove 20K2 may be disposed in the non-transparent region NTA, and an orthographic projection of the second groove 20K2 on the substrate 10 at least partially surrounds an orthographic projection of the second opening LK of the transparent region TA on the substrate 10. The drive array layer 20 may include multiple metal layers and multiple insulating layers. In this embodiment, the second groove 20K2 provided in the drive array layer 20 may be understood to be a second groove 20K2 provided in any one or more of the multiple film layers of the drive array layer 20, and further, the second groove 20K2 and the first groove 20K1 may be made of the same film layer. In the drawings of this embodiment, an example in which the film layers of the first groove 20K1 and the second groove 20K2 are provided as the planarizing layer facing to the light-shielding layer 30 is used for exemplary description. After the structure such as the driver circuit of the drive array layer 20 is fabricated and completed, an insulating planarizing layer needs to be provided to planarize the fabricated film layers of the subsequent light-shielding layer 30. In a specific implementation, the opening film layers of the first groove 20K1 and the second groove 20K2 may be any one or more film layers between the light-shielding layer 30 and the substrate 10, that is, any one or more film layers of the drive array layer 20 cooperate to form the first groove 20K1 and the second groove 20K2, and this embodiment is not limited herein.

According to this embodiment, the orthographic projection of the second groove 20K2 on the substrate 10 at least partially surrounds the orthographic projection of the second opening LK on the substrate 10, so that the drive array layer 20 in the region where the second groove 20K2 is located may be depressed to a certain extent, and the height of the depression is the depth of the second groove 20K2. Since the second groove 20K2 in the drive array layer 20 is disposed so that during the fabrication process of the light-shielding layer 30, the light-shielding layer 30 is flowed and filled to the position of the second groove 20K2 by virtue of good fluidity when it is not cured, that is, at least part of the light-shielding layer 30 is located within the second grooves 20K2, it is possible to prevent the light-shielding layer 30 from extending to the position of the transparent region TA due to overflow or overflow before it is not cured, thereby affecting the area of the transparent region TA and being conductive to ensuring the transparent display effect.

It should be understood that the opening film layer of the second groove 20K2 in this embodiment may be the same as the opening film layer of the first groove 20K1, and the opening shape of the second groove 20K2 may be the same as or different from the first groove 20K1, so long as the second groove 20K2 can slow down the flow rate of the light-shielding layer 30 to the transparent region TA before the light-shielding layer 30 is cured, this embodiment is not specifically limited herein.

Figure 36:
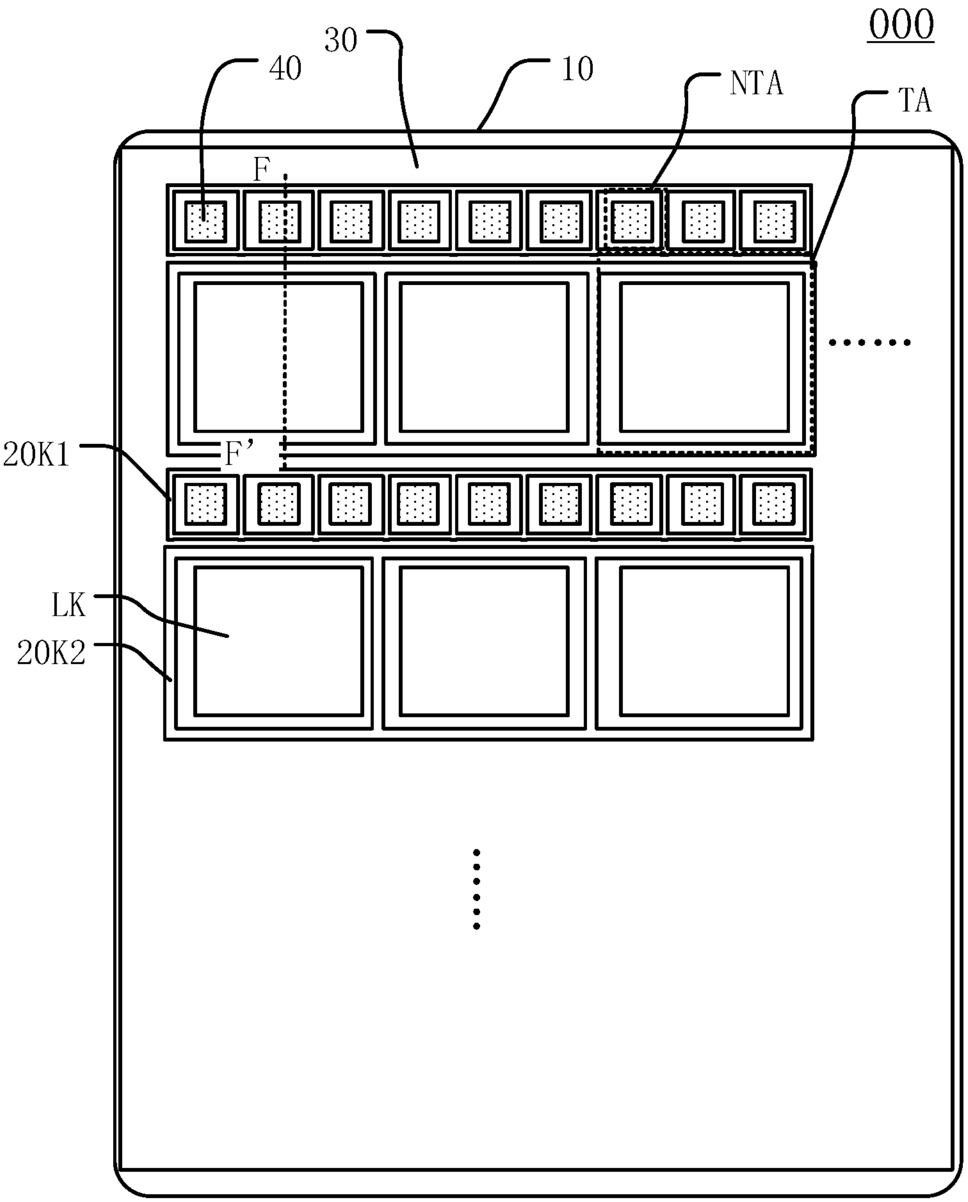
FIG. 36 is another plan view of a display panel according to an embodiment of the present disclosure.
Figure 37:
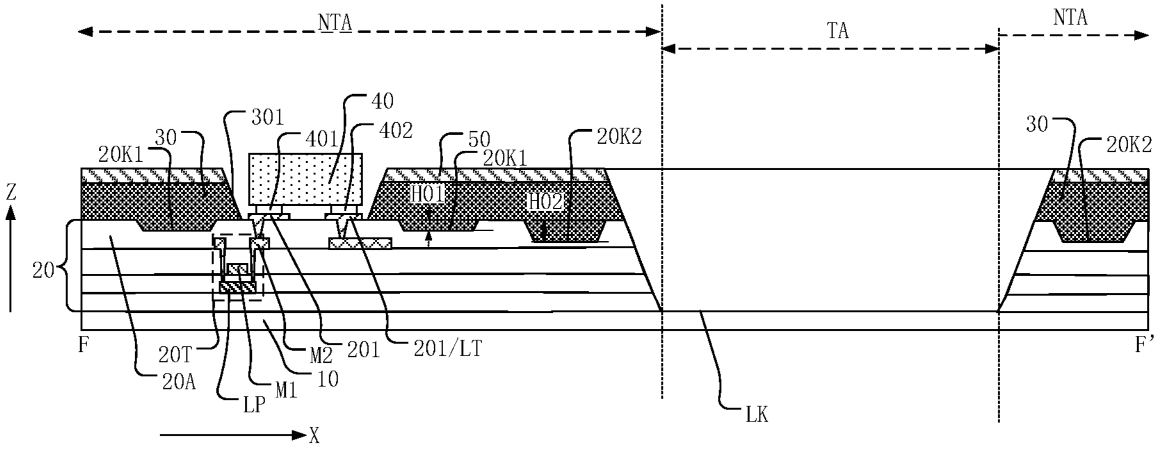
FIG. 37 is a cross-sectional view taken along a direction F-F' of FIG. 36.
Figure 38:
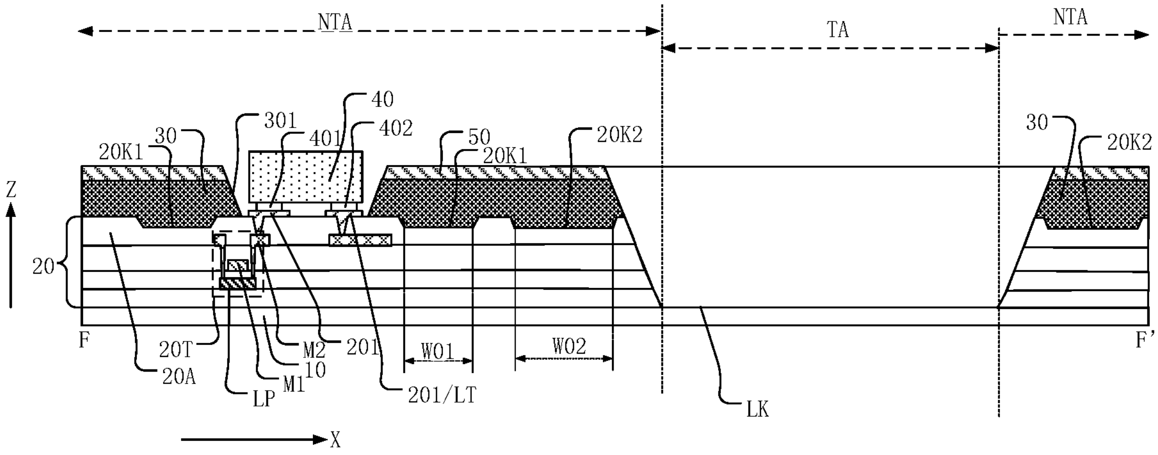
FIG. 38 is another cross-sectional view taken along a direction F-F' of FIG. 36.
Figure 39:
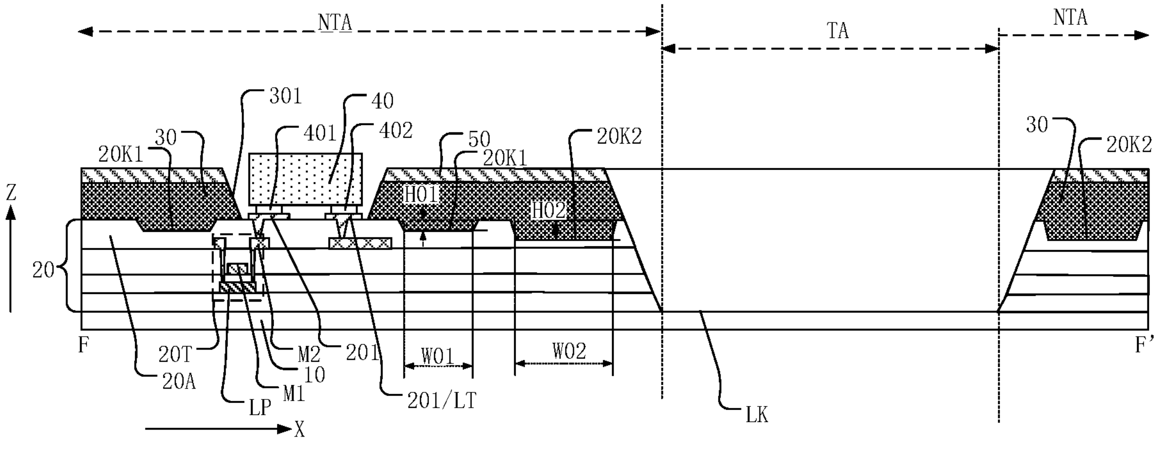
FIG. 39 is another cross-sectional view taken along a direction F-F' of FIG. 36.

In some optional embodiments, referring to FIG. 36 and FIGS. 37 to 39, FIG. 36 is another plan view of a display panel according to an embodiment of the present disclosure, FIG. 37 is a cross-sectional view taken along a direction F-F' of FIG. 36, FIG. 38 is another cross-sectional view taken along a direction F-F' of FIG. 36, and FIG. 39 is another cross-sectional view taken along a direction F-F' of FIG. 36 (it should be understood that the transparent filling is performed in FIG. 36 in order to clearly illustrate the structure of this embodiment). In this embodiment, in a direction Z perpendicular to a plane where the substrate 10 is located, a depth H02 of the second groove 20K2 is greater than a depth H01 of each of the multiple first grooves 20K1; and/or in a direction parallel to a plane where the substrate 10 is located and along the direction in which the same first groove 20K1 is directed towards the light-emitting component 40 (the first direction X shown in the drawings), a width of each of the multiple first grooves 20K1 is W01, and in a direction parallel to a plane where the substrate 10 is located and along a direction in which the second groove 20K2 is directed towards the transparent region TA (the first direction X shown in the drawings), a width of the second groove 20K2 is W02, where W02>W01.

This embodiment illustrates that the drive array layer 20 is provided with the first groove 20K1 and the second groove 20K2, the first groove 20K1 and the second groove 20K2 may be disposed in the non-transparent region NTA, an orthographic projection of the second groove 20K2 on the substrate 10 at least partially surrounds an orthographic projection of the second opening LK on the substrate 10, the orthographic projection of the first groove of the multiple first grooves 20K1 on the substrate 10 at least partially surrounds the orthographic projection of the respective first opening of the multiple first openings 301 on the substrate 10, and the width and depth of the first groove 20K1 and the second groove 20K2 may be designed differently. As shown in FIGS. 36 and 37, the depth H02 of the second groove 20K2 is greater than the depth H01 of the first groove 20K1 in the direction Z perpendicular to the plane where the substrate 10 is located. Or, as shown in FIGS. 36 and 38, in the direction parallel to the plane where the substrate 10 is located and along the direction (the first direction X shown in the drawings) in which the multiple first grooves 20K1 are directed towards the multiple light-emitting components 40, the width W02 of the second groove 20K2 may be greater than the width W01 of the first groove 20K1. Or, as shown in FIGS. 36 and 39, in the direction Z perpendicular to the plane where the substrate 10 is located, the depth H02 of the second groove 20K2 is greater than the depth H01 of the first groove 20K1, and in the direction parallel to the plane where the substrate 10 is located and along the direction (the first direction X shown in the drawings) in which the multiple first grooves 20K1 are directed towards the multiple light-emitting components 40, the width W02 of the second groove 20K2 may be greater than the width W01 of the first groove 20K1, so that the second groove 20K2 around the transparent region TA are relatively deep in depth and/or relatively wide in width, and the first groove 20K1 around the light-emitting component 40 are relatively shallow in depth and/or relatively narrow in width, whereby the space filled by the light-shielding layer 30 in the second groove 20K2 around the transparent region TA is raised, and the speed of the light-shielding layer 30 flowing towards the transparent region TA before being uncured is further slowed, and the design area of the transparent region TA is ensured.

Figure 40:
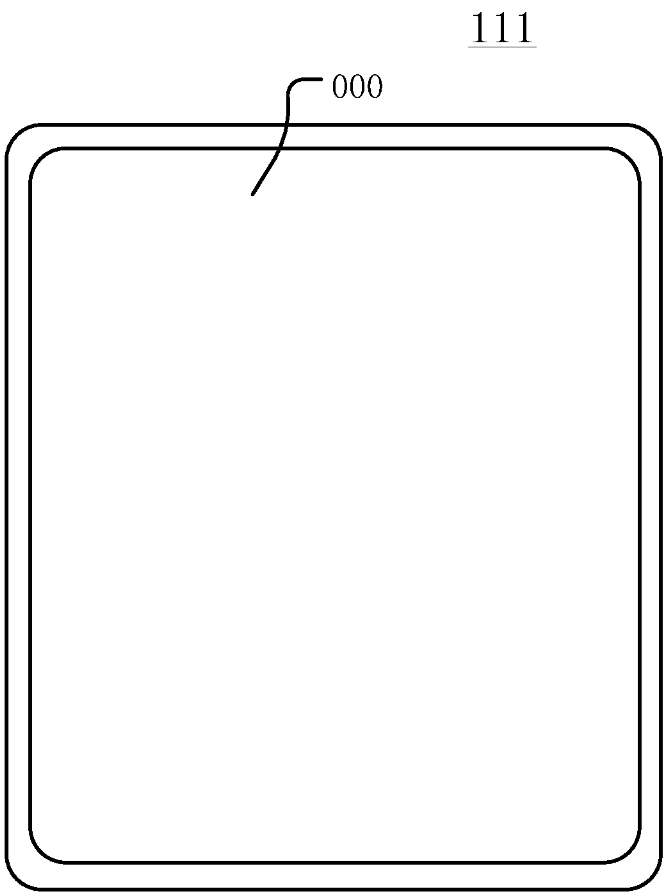
FIG. 40 is a plan view of a display device according to an embodiment of the present disclosure.

In some optional embodiments, referring to FIG. 40, FIG. 40 is a plan view of a display device according to an embodiment of the present disclosure. The display device 111 provided in this embodiment includes the display panel 000 provided in the above-described embodiments of the present disclosure. The display device 111 in the embodiment of FIG. 40 will be described only by using a mobile phone as an example. It should be understood that the display device 111 provided in the embodiment of the present disclosure may be another display device 111 having a display function, such as a computer, a television, or an in-vehicle display device. The present disclosure is not specifically limited thereto. The display device 111 provided in the embodiment of the present disclosure has the beneficial effects of the display panel 000 provided in the embodiments of the present disclosure. For details, reference may be made to the detailed description of the display panel 000 according to the above-described embodiments, and details of the embodiments are not described herein.

As can be seen from the above-described embodiments, the display panel and the display device provided in the present disclosure have at least the following beneficial effects.

The display panel provided in the present disclosure includes a substrate, the substrate is used as a carrier substrate for fabricating a film layer structure such as the drive array layer, the light-shielding layer, and the light-emitting component on a side of the substrate. The drive array layer may be understood as a film layer for fabricating a driver circuit structure for driving the light-emitting component to emit light, such as a circuit structure for fabricating a thin film transistor for driving the light-emitting component to emit light. A side of the drive array layer facing away from the substrate includes the light-shielding layer. A material for fabricating the light-shielding layer may be a material which is insulated and capable of shielding light. The light-shielding layer includes the multiple first openings. The first openings penetrate through the light-shielding layer. The first openings are used for exposing binding electrodes of a binding layer, so that after the subsequent light-emitting component is transferred, in this first opening, a cathode and an anode of the light-emitting component are respectively bound with and electrically connected to the binding electrodes exposed by the first openings. The light-shielding layer is provided with the first opening only at a position where the light-emitting component needs to be bound, and remaining regions are shielded by a material of the light-shielding layer, so that the screen reflectivity can be effectively reduced, and the influence of external light on the display effect of the display panel can be avoided. In the present disclosure, the drive array layer is set to include the multiple first grooves, the orthographic projection of the first groove of the multiple first grooves on the substrate at least partially surrounds the orthographic projection of the respective first opening of the multiple first openings on the substrate, so that the drive array layer in a region in which the first grooves are located may be depressed to a certain extent, and a depression height is the depth of the first groove. In a fabrication process of the light-shielding layers, before the light-shielding layer is not cured, the light-shielding layer flows and is filled to a position where the first groove is located by utilizing the good fluidity of the light-shielding layer when the light-shielding layer is not cured, so that a thickness of the light-shielding layer in a region outside the first groove may be greatly reduced, and further, a problem of bonding interference at the time of transfer due to the higher film layer height around the light-emitting components may be improved, the risk of interference between the microstamp and film layers around the light-emitting components in a depression process of using the microstamp to transfer the light-emitting components can be reduced, the transfer efficiency of the light-emitting components and the subsequent binding yield with the binding electrode can be improved, and thus the display quality can be ensured.

While some specific embodiments of the present disclosure have been described in detail by way of instance, it should be understood by those skilled in the art that the above instances are for purposes of illustration only and are not intended to limit the scope of the present disclosure. It should be understood by those skilled in the art that modifications may be made to the above embodiments without departing from the scope and spirit of the present disclosure. The scope of the present disclosure is defined by the appended claims.

What is claimed is:

1. A display panel, comprising:

a substrate;

a drive array layer, wherein the drive array layer is located on a side of the substrate and comprises a plurality of first grooves;

a light-shielding layer, wherein the light-shielding layer is located on a side of the drive array layer facing away from the substrate, the light-shielding layer comprises a plurality of first openings, the plurality of first openings penetrate through the light-shielding layer, and an orthographic projection of a first groove of the plurality of first grooves on the substrate at least partially surrounds an orthographic projection of a respective first opening of the plurality of first openings on the substrate; and a plurality of light-emitting components, an orthographic projection of a light-emitting component of the plurality of light-emitting components on the substrate at least partially overlaps with an orthographic projection of a respective first opening of the plurality of first openings on the substrate;

wherein at least part of the light-shielding layer is located within the plurality of first grooves, wherein the drive array layer comprises a plurality of thin film transistors, a thin film transistor of the plurality of thin film transistors comprises an active portion, and the first groove is located on a side of a film layer on which the active portion is located facing away from the substrate.

2. The display panel of claim 1, wherein at least part of the light-shielding layer is located outside the plurality of first grooves;

outside a region where the plurality of first grooves are located, a thickness of the light-shielding layer in a direction perpendicular to a plane where the substrate is located is D1; and in the region where the plurality of first grooves are located, a thickness of the light-shielding layer in the direction perpendicular to the plane where the substrate is located is D2, wherein D1<D2.

3. The display panel of claim 2, wherein at least part of the light-shielding layer is located on a side of a first groove of the plurality of first grooves facing to a respective one of the plurality of light-emitting components.

4. The display panel of claim 1, wherein a same first groove among the plurality of first grooves comprises a first portion and a second portion, and the first portion and the second portion satisfy at least one of:

in a direction perpendicular to a plane where the substrate is located, a depth of the first portion is different from a depth of the second portion; or in a direction parallel to a plane where the substrate is located and along a direction in which the same first groove is directed towards the light-emitting component, a width of the first portion is different from a width of the second portion.

5. The display panel of claim 4, wherein the first portion and the second portion satisfy at least one of:

in the direction parallel to the plane where the substrate is located and along the direction in which the same first groove is directed towards the light-emitting component, the width of the first portion is greater than the width of the second portion; or in the direction perpendicular to the plane where the substrate is located, the depth of the first portion is greater than the depth of the second portion;

the drive array layer comprises a plurality of thin film transistors, a distance between an orthographic projection of the first portion on the substrate and an orthographic projection of a thin film transistor of the plurality of thin film transistors on the substrate is D3, and a distance between an orthographic projection of the second portion on the substrate and the orthographic projection of the thin film transistor on the substrate is D4, wherein $D3<D4$.

6. The display panel of claim 4, wherein, in the direction parallel to the plane where the substrate is located, a shortest distance from the first portion to the light-emitting component is L1, and a shortest distance from the second portion to the light-emitting component is L2;

in the direction parallel to the plane where the substrate is located and along the direction in which the first groove is directed towards the light-emitting component, the width of the first portion is W1, and the width of the second portion is W2; and in the direction perpendicular to the plane where the substrate is located, the depth of the first portion is H1, and the depth of the second portion is H2, wherein at least one of following formulas is satisfied: $(L1-L2)\times(W1-W2)<0$, or $(L1-L2)\ (H1-H2)<0$.

7. The display panel of claim 1, wherein, the orthographic projection of the first groove on the substrate is a strip-like structure;

in a direction parallel to a plane where the substrate is located, the first groove is located between two adjacent light-emitting components of the plurality of light-emitting components.

8. The display panel of claim 1, wherein, the orthographic projection of the first groove on the substrate is an annular structure; and the orthographic projection of the first groove on the substrate surrounds an orthographic projection of at least one of the plurality of light-emitting components on the substrate.

9. The display panel of claim 8, wherein the plurality of first grooves comprise at least a first sub-groove and a second sub-groove, an orthographic projection of the first sub-groove on the substrate surrounds an orthographic projection of one light-emitting component of the plurality of light-emitting components on the substrate, and an orthographic projection of the second sub-groove on the substrate surrounds orthographic projections of two light-emitting components of the plurality of light-emitting components on the substrate; and the orthographic projection of the first sub-groove on the substrate at least partially overlaps with the orthographic projection of the second sub-groove on the substrate.

10. The display panel of claim 1, wherein the drive array layer comprises a plurality of first signal lines, at least a partial segment of a first signal line of the plurality of first signal lines overlaps with a respective first groove of the plurality of first grooves in a direction perpendicular to a plane where the substrate is located, wherein a first groove of the plurality of first grooves comprises a first region and a second region;

in the direction perpendicular to the plane where the substrate is located, a depth of the first groove in the first region is greater than a depth of the first groove in the second region, and the first signal line does not overlap with the first groove in the first region.

11. The display panel of claim 1, wherein the drive array layer comprises at least a first insulating layer, and the plurality of first grooves are located in the first insulating layer, wherein no other insulating layer is comprised between the first insulating layer and the light-shielding layer.

12. The display panel of claim 11, wherein a depth of the first groove is less than or equal to a thickness of the first insulating layer in a direction perpendicular to a plane where the substrate is located.

13. The display panel of claim 1, wherein a side wall of the first groove comprises one of a beveled shape or a stepped shape.

14. A display device comprising the display panel of claim 1.

15. A display panel, comprising:

a substrate;

a drive array layer, wherein the drive array layer is located on a side of the substrate and comprises a plurality of first grooves;

a light-shielding layer, wherein the light-shielding layer is located on a side of the drive array layer facing away from the substrate, the light-shielding layer comprises a plurality of first openings, the plurality of first openings penetrate through the light-shielding layer, and an orthographic projection of a first groove of the plurality of first grooves on the substrate at least partially surrounds an orthographic projection of a respective first opening of the plurality of first openings on the substrate; and a plurality of light-emitting components, an orthographic projection of a light-emitting component of the plurality of light-emitting components on the substrate at least partially overlaps with an orthographic projection of a respective first opening of the plurality of first openings on the substrate;

wherein at least part of the light-shielding layer is located within the plurality of first grooves, wherein the drive array layer comprises at least a first insulating layer and a second insulating layer, the second insulating layer is located on a side of the first insulating layer facing the substrate; and the first groove comprises a first hollow portion located in the first insulating layer and a second hollow portion located in the second insulating layer, and the first hollow portion and the second hollow portion overlap with each other in a direction perpendicular to a plane where the substrate is located, wherein in the direction perpendicular to the plane where the substrate is located, a depth of the first hollow portion is less than or equal to a thickness of the first insulating layer, and a depth of the second hollow portion is less than or equal to a thickness of the second insulating layer.

16. A display panel, comprising:

a substrate:

a drive array layer, wherein the drive array layer is located on a side of the substrate and comprises a plurality of first grooves;

a light-shielding layer, wherein the light-shielding layer is located on a side of the drive array layer facing away from the substrate, the light-shielding layer comprises a plurality of first openings, the plurality of first openings penetrate through the light-shielding layer, and an orthographic projection of a first groove of the plurality of first grooves on the substrate at least partially surrounds an orthographic projection of a respective first opening of the plurality of first openings on the substrate; and a plurality of light-emitting components, an orthographic projection of a light-emitting component of the plurality of light-emitting components on the substrate at least partially overlaps with an orthographic projection of a respective first opening of the plurality of first openings on the substrate;

wherein at least part of the light-shielding layer is located within the plurality of first grooves, wherein the display panel comprises a transparent region and a non-transparent region, the plurality of light-emitting components are located in the non-transparent region, and a side of the substrate in the transparent region comprises a second opening;

the second opening penetrates through a film layer on the side of the substrate in a direction facing to the substrate, and the second opening is filled with a transparent material.

17. The display panel of claim 16, wherein the light-shielding layer covers at least a part of a side wall of the second opening.

18. The display panel of claim 16, wherein the drive array layer further comprises a second groove, an orthographic projection of the second groove on the substrate at least partially surrounds an orthographic projection of the second opening on the substrate; and at least a part of the light-shielding layer is located within the second groove.

19. The display panel of claim 18, wherein the second groove and the first groove satisfy at least one of:

in a direction perpendicular to a plane where the substrate is located, a depth of the second groove is greater than a depth of the first groove; or in a direction parallel to a plane where the substrate is located and along the direction in which the first groove is directed towards the light-emitting component, a width of the first groove is W01; and in a direction parallel to a plane where the substrate is located and along a direction in which the second groove is directed towards the transparent region, a width of the second groove is W02, wherein W02>W01.

* * * * *